US012332280B2

United States Patent
Oura et al.

(10) Patent No.: US 12,332,280 B2
(45) Date of Patent: Jun. 17, 2025

(54) VOLTAGE SOURCE APPROACH DETECTION VOLTAGE DETECTOR

(71) Applicants: KANDENKO CO., LTD., Tokyo (JP); Sanwa Electric Instrument Co., Ltd., Tokyo (JP); CDN CORPORATION, Miyazaki (JP)

(72) Inventors: Yoji Oura, Yachiyo (JP); Masami Kojima, Hachioji (JP); Masakatsu Sawada, Fujisawa (JP); Ryuzo Noda, Miyazaki (JP); Kazuaki Matsuo, Miyazaki (JP)

(73) Assignees: Kandenko Co., Ltd, Tokyo (JP); Sanwa Electric Instrument Co., Ltd., Tokyo (JP); CDN Corporation, Miyazaki (JP)

( * ) Notice: Subject to any disclaimer, the term of this patent is extended or adjusted under 35 U.S.C. 154(b) by 280 days.

(21) Appl. No.: 18/192,192

(22) Filed: Mar. 29, 2023

(65) Prior Publication Data
US 2024/0329088 A1    Oct. 3, 2024

(51) Int. Cl.
G01R 15/14    (2006.01)
G01R 19/165    (2006.01)
G08B 21/18    (2006.01)

(52) U.S. Cl.
CPC ..... G01R 15/144 (2013.01); G01R 19/16576 (2013.01); G08B 21/182 (2013.01)

(58) Field of Classification Search
CPC ............ G01R 15/144; G01R 19/16576; G01R 19/155; G01R 29/0857; G01R 29/12; G08B 21/182; G08B 21/02

(Continued)

(56) References Cited

U.S. PATENT DOCUMENTS 10,557,875 B2 *    2/2020    Steuer ................ G01R 19/2506
10,573,156 B2 *    2/2020    Figura ..................... H04Q 9/00
(Continued)

FOREIGN PATENT DOCUMENTS

JP    H08220151 A    8/1996
JP    6467447 B2    2/2019

OTHER PUBLICATIONS

Yoji Oura, "Development of the sensor that detects the proximity of the AC voltage source to human body", Kandenko Technical News No. 29, Dec. 2019.

(Continued)

*Primary Examiner* — Eric Blount
(74) *Attorney, Agent, or Firm* — Vorys, Sater, Seymour and Pease LLP

(57)    ABSTRACT

The present disclosure provides a voltage detector capable of alerting a worker to nearby presence of a voltage source regardless of the worker's awareness simply by being worn on the worker's body. In a voltage detector for detecting approach to a voltage source, a voltage induced in a human body due to approach to a voltage source is measured by a first electrode of a detection circuit, a voltage to ground is measured by a second electrode of the same circuit, the detection circuit captures a current generated due to a difference between an electric potential of the first electrode and an electric potential of the second electrode, and output from the detection circuit is displayed for warning when the human body insulated from the ground approaches the voltage source.

18 Claims, 26 Drawing Sheets

(58) Field of Classification Search
USPC .......................................................... 340/660
See application file for complete search history.

(56) References Cited

U.S. PATENT DOCUMENTS

2011/0234414 A1* 9/2011 Ojeda ................ G01R 29/0857
340/635
2019/0346494 A1* 11/2019 Steuer ...................... G01R 1/04

OTHER PUBLICATIONS

Yoji Oura et al., "Development of the sensor that detects the proximity of the AC voltage source to human body", a preliminary draft related to the Institute of Electrical Installation Engineers of Japan, Aug. 2020.

Yoji Oura et al., "Development of the sensor that detects the proximity of the AC voltage source to human body", Electrical Installation Technology, May 5, 2021.

Yoji Oura et al., "Development of the sensor that detects the proximity of the AC voltage source to human body", The Papers of Technical Meeting on "Smart Facilities", IEE Japan, SMF-22-003, Jan. 7, 2022.

* cited by examiner

Fig. 6

| The shape of electrode | approached from the sensor side | approached from the human body side | |
|---|---|---|---|
| The circular disc-shaped electrode (430) | 750 mm | 100 mm | The second electrode / The substrate |
| The dome-shaped electrode (15, 430) | 850 mm | 200 mm | The second electrode / The substrate |
| The cylindrical electrode (10) | 100 mm | 450 mm | The second electrode / The substrate |

Fig. 14A

| The distance [cm] | 3kV | 2kV | 1kV |
|---|---|---|---|
| The distance between a live wire and a human body | The electric field strength of a human body | The electric field strength of a human body | The electric field strength of a human body |
| 10 | 881 | 642 | 468 |
| 30 | 613 | 473 | 357 |
| 50 | 461 | 373 | 263 |
| 70 | 373 | 299 | 195 |
| 90 | 308 | 237 | 151 |
| 110 | 240 | 184 | 96 |
| 130 | 193 | 153 | 72 |
| 150 | 163 | 113 | 48 |
| 170 | 126 | 82 | 31 |
| 190 | 89 | 57 | 20 |
| 210 | 61 | 38 | 13 |
| 230 | 42 | 25 | 6 |
| 250 | 29 | 16 | 2 |
| 270 | 18 | 9 | 0 |
| 290 | 10 | 3 | 0 |
| 310 | 3 | 1 | 0 |
| 330 | 0 | 0 | 0 |
| 350 | 0 | 0 | 0 |

Fig. 14B

| The distance [cm] | 300V | 100V |
|---|---|---|
| The distance between a live wire and a human body | The electric field strength of a human body | The electric field strength of a human body |
| 10 | 224 | 108 |
| 30 | 166 | 52 |
| 50 | 104 | 30 |
| 70 | 63 | 15 |
| 90 | 40 | 8 |
| 110 | 25 | 2 |
| 130 | 14 | 0 |
| 150 | 8 | 0 |
| 170 | 3 | 0 |
| 190 | 0 | 0 |
| 210 | 0 | 0 |
| 230 | 0 | 0 |
| 250 | 0 | 0 |
| 270 | 0 | 0 |
| 290 | 0 | 0 |
| 310 | 0 | 0 |
| 330 | 0 | 0 |
| 350 | 0 | 0 |

Fig. 16A

The electric field strength in spaces when the AC voltage source was a live wire at 3 kV and the behavior of the sound an alarm

| Number | ③ | ① | ② | ④ |
|---|---|---|---|---|
| The sensor-side electrode | Rod shape, Length=10mm | Rod shape, Length=20mm | Cylindrical, Diameter=35-7mm | Rod shape, Length=10mm |
| The human body-side electrode | Rectangle, 60×30mm | Circular disc, Diameter=40mm | Circular disc, Diameter=40mm | Circular disc, Diameter=40mm |
| The sensor mounting position | The rear of helmet | The rear of helmet | The rear of helmet | The rear of helmet |

Fig. 16B

| Distance [cm] | The electric field strength in spaces (V/m) | | | The count of sound an alarm once a ten second | | | |
|---|---|---|---|---|---|---|---|
| The between a live wire and a human body | The electric field strength of a human body | The electric field strength around the head | The difference of the electric field strength | ③Forward approach | ③Rearward approach | ①Forward approach | ①Rearward approach |
| 10 | 903 | 448 | 455 | Short series | Short series | Short series | Short series |
| 30 | 610 | 365 | 245 | Short 6 | Short series | Short series | Short series |
| 50 | 440 | 300 | 140 | Short 8 | Short series | Short 30 | Short series |
| 70 | 353 | 233 | 120 | Short 7 | Short series | Short 30 | Short series |
| 90 | 278 | 184 | 94 | Short 6 | Short series | × | Short series |
| 110 | 230 | 130 | 100 | Short 5 | Short 30 | × | Short series |
| 130 | 178 | 98 | 80 | × | Short 20 | × | Short series |
| 150 | 142 | 67 | 75 | × | Short 12 | × | Short series |
| 170 | 101 | 42 | 59 | × | Short 10 | × | Short series |
| 190 | 77 | 26 | 51 | × | Short 8 | × | Short series |
| 210 | 47 | 13 | 34 | × | Short 7 | × | Intermittent short series |
| 230 | 31 | 6 | 25 | × | Short 5 | × | Short 21 |
| 250 | 18 | 0 | 18 | × | × | × | Short 4 |
| 270 | 6 | 0 | 6 | × | × | × | × |
| 290 | 0 | 0 | 0 | × | × | × | × |
| 310 | 0 | 0 | 0 | × | × | × | × |
| 330 | 0 | 0 | 0 | × | × | × | × |
| 350 | 0 | 0 | 0 | × | × | × | × |

Fig. 16C

| Distance[cm] | The electric field strength in spaces (V/m) | | | The count of sound an alarm once a ten second | | | |
|---|---|---|---|---|---|---|---|
| The between a live wire and a human body | The electric field strength of a human body | The electric field strength around the head | The difference of the electric field strength | ②Forward approach | ②Rearward approach | ④Forward approach | ④Rearward approach |
| 10 | 903 | 448 | 455 | Short series | Short series | Short series | Short series |
| 30 | 610 | 365 | 245 | Short series | Short series | Short series | Short series |
| 50 | 440 | 300 | 140 | Short series | Short series | Short series | Short series |
| 70 | 353 | 233 | 120 | Short series | Short series | Short series | Short series |
| 90 | 278 | 184 | 94 | Short series | Short series | Short series | Short series |
| 110 | 230 | 130 | 100 | Short series | Short series | Short series | Short series |
| 130 | 178 | 98 | 80 | Short series | Short series | Short series | Short series |
| 150 | 142 | 67 | 75 | Short series | Short series | Short series | Short series |
| 170 | 101 | 42 | 59 | Short 28 | Short series | Short 29 | Short series |
| 190 | 77 | 26 | 51 | Short 21 | Short series | Short 27 | Short series |
| 210 | 47 | 13 | 34 | × | Short series | × | Short series |
| 230 | 31 | 6 | 25 | × | Short series | × | Short series |
| 250 | 18 | 0 | 18 | × | Short series | × | Short series |
| 270 | 6 | 0 | 6 | × | Short series | × | Short series |
| 290 | 0 | 0 | 0 | × | Intermittent short series | × | Short 30 |
| 310 | 0 | 0 | 0 | × | Short 27 | × | Short 26 |
| 330 | 0 | 0 | 0 | × | Short 15 | × | Short 4 |
| 350 | 0 | 0 | 0 | × | × | × | × |

VOLTAGE SOURCE APPROACH DETECTION VOLTAGE DETECTOR

TECHNICAL FIELD

The present disclosure relates to a voltage source approach detection voltage detector.

BACKGROUND ART

As illustrated in FIG. 22, when an electrode of a conventional voltage detector for a voltage source is brought close to a charged part as an object to be measured with a human body, which is capacitance-coupled to the ground, being a reference, a detection circuit of the voltage detector detects a minute current through a capacitance $C_1$ between the charged part and the voltage detector, a capacitance $C_2$ between the voltage detector and a worker, and a capacitance $C_3$ between the worker and the ground. Then, in the case where the current is equal to or greater than a certain value, it is determined that a voltage is present in the object to be measured, and the voltage detector provides display or emits a warning about the presence of the voltage.

Conventionally, this type of the voltage detector has been widely used. In Patent Document 1, the following voltage detector is disclosed. The voltage detector is worn on a wrist, an electrode thereof is projected in a direction toward a fingertip from a voltage detector body, and the voltage detector is brought close to an object to be measured, so as to detect the voltage. In addition, the following voltage detector is disclosed in Patent Document 2. A voltage detection electrode of the voltage detector is tightly attached to a handle portion of a tool. Then, the worker grips the tool and brings the tool close to the object to be measured, so as to detect the voltage of the object to be measured and emits the warning.

CITATION LIST

Patent Documents

Patent Document 1: JP-A-8-220151
Patent Document 2: Japanese Patent No. 6467447

DISCLOSURE OF THE INVENTION

Technical Problem

In regard to these voltage detectors, the worker has to wear and hold the voltage detector over the object to be measured, or brings the tool, which is held in the worker's hand, close to the object to be measured. That is, the worker is required to use the voltage detector correctly without being careless in measuring the voltage. A lack of either one of these increases a chance of the above-described accidents.

In view of the above, the present disclosure has been made to solve the above-described problem and therefore has a purpose of providing a voltage detector capable of alerting a worker to nearby presence of a voltage source regardless of the worker's awareness simply by being worn on the worker's body.

Solution to Problem

For the conventional voltage detector, the voltage of the voltage source such as a power line is set as a measurement target, and the conventional voltage detector measures an inflow current to the human body that is capacitance-coupled to the voltage source. Meanwhile, a voltage detector according to the present disclosure significantly differs from the conventional voltage detector in a point that the voltage detector according to the present disclosure has, as a measurement target, a voltage $V_{02}$ that is generated to the human body by $V_0$ of a voltage source illustrated in FIG. 2, a capacitance $C_{01}$ between a charged part and the human body, and a capacitance $C_{02}$ between the human body and the ground and measures an outflow current, which is generated by the voltage, from the human body.

More specifically, the disclosure in a first aspect is
a voltage source approach detection voltage detector that detects approach to a voltage source in which
a detection circuit has: a first electrode, for which a voltage induced in a human body due to approach to the voltage source is set as a measurement target; and a second electrode, for which a voltage to the ground is set as a measurement target,
a circuit is provided to output a signal from the detection circuit at the time when the human body approaches the voltage source,
the first electrode is formed of a plate having a predetermined area with a dielectric body being interposed between the first electrode and the human body, and
the second electrode has such a shape that a perpendicular projection area to the first electrode is small while an area for the ground is large.
The disclosure in a second aspect is
the voltage source approach detection voltage detector as described in the first aspect above in which
a magnitude of the voltage source in surroundings where the voltage detector is approaching is detected for plural times,
a change amount of the magnitude of the voltage source per unit time is calculated on the basis of the detected magnitude of the voltage source, and
in the case where the change amount is equal to or greater than a predetermined value, a warning is output.
The disclosure in a third aspect is
the voltage source approach detection voltage detector as described in the first aspect above in which
a magnitude of the voltage source in surroundings where the voltage detector is approaching is detected for plural times,
in the case where the detected magnitude of the voltage source is equal to or greater than a predetermined value, a warning is output, and a change amount of the magnitude of the voltage source per unit time is calculated on the basis of the detected magnitude of the voltage source, and
in the case where the change amount is equal to or greater than a predetermined value, the warning is output.
The disclosure in a fourth aspect may be
the voltage source approach detection voltage detector according to any one of the above described first, second or third aspects in which
the dielectric bodies, each of which is interposed between the voltage source approach detection voltage detector and the human body, are an insulation container accommodating the first electrode and the second electrode, and any of a work cloth, a helmet, a shoe, and a belt.
The disclosure in a fifth aspect may be
the voltage source approach detection voltage detector according to any one of the above described first, second third or fourth aspects in which
the first electrode is a flat plate, and the second electrode has a pole shape that stands vertically on the flat plate of the first electrode.

The disclosure in a sixth aspect may be
the voltage source approach detection voltage detector according to any one of the above described first, second third or fourth aspects in which
the first electrode is a flat plate, and
the second electrode has a cylindrical shape that stands vertically on the flat plate of the first electrode.

The disclosure in a seventh aspect may be
the voltage source approach detection voltage detector according to any one of the above described first, second, third, fourth, fifth or sixth aspects in which
the first electrode, the second electrode, and the detection circuit are accommodated in the insulation container.

Advantageous Effects of Invention

According to the disclosure, in the case where the voltage detector is attached to any part of the human body, a signal is output when a worker wearing the voltage detector approaches the voltage source. Therefore, even in the case where the worker carelessly approaches a charged part during an electrical service or the like, the worker can be alerted, and thus an accident such as an electric shock can be prevented in advance.

BRIEF DESCRIPTION OF DRAWINGS

FIG. 6 is a comparative table illustrating a comparison of sensitivity according to the shape of the second electrode in the voltage detector according to the first embodiment of the present disclosure.

FIG. 12A, 12B include side views, each of which illustrates a state where the voltage detector according to the second embodiment of the present disclosure is attached to a worker's helmet, in which FIG. 12A is a view of fastening with a clip and FIG. 12B is a view of fastening with a band.

FIG. 13A, 13B include side views, each of which illustrates a state where the voltage detector according to the second embodiment of the present disclosure is attached to a work shoe, in which FIG. 13A is a view in which the voltage detector is attached to a heel with the clip and FIG. 13B is a view in which the voltage detector is attached to a toe with the band.

FIGS. 14A, 14B and 14C include a table and a graph of values that are acquired by measuring electric field strength according to a distance between the voltage source and the human body at each voltage.

FIGS. 16A, 16B and 16C are a table illustrating a measured alarm state according to the distance from the human body by using the voltage detector according to the second embodiment of the present disclosure when the live wire at the voltage of 3.3 kV is the voltage source.

DESCRIPTION OF EMBODIMENTS

First Embodiment

First, before making a description on a voltage detection method and a voltage detector according to a first embodiment of the present disclosure, a description will be made on measurement of an electric potential on each part of a human body. In regard to a main circuit of the voltage detector according to the first embodiment, V and C are added with "0" when indicating a voltage and a capacitance, respectively. However, V and C in relation to a detection circuit are indicated without "0".

Figure 1:
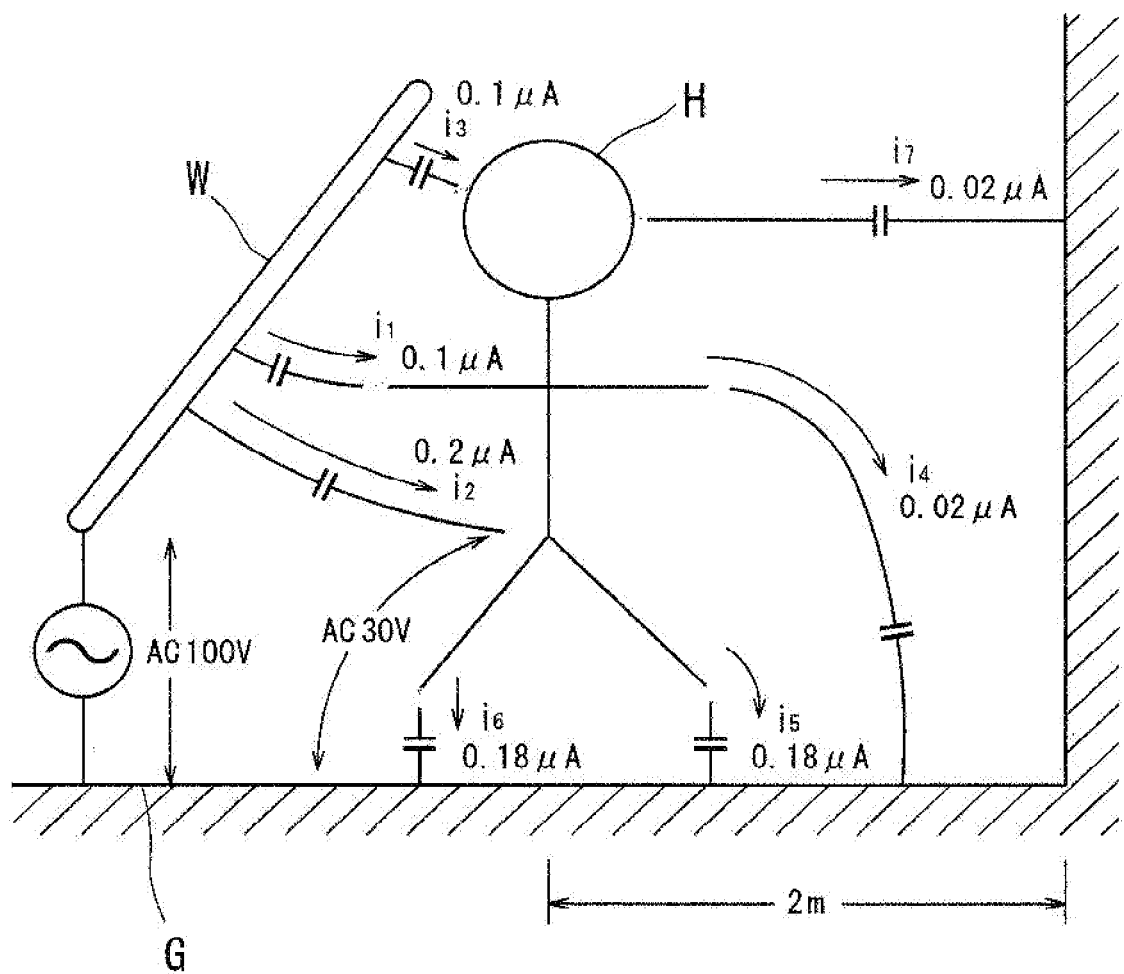
FIG. 1 is a principle explanatory view illustrating generation of a current flowing through a human body and generation of a current flowing out of the human body at the time when the human body approaches a voltage source.

First, it was examined how the electric potential was distributed in the human body. For this examination, as illustrated in FIG. 1, the electric potential was measured on both wrists, both ankles, and a head of a human body, which approached an AC wire, by using an AC potential wireless measuring instrument.

It was confirmed from the measurement result that, while it was natural that the electric potential was generated on a hand extending to the AC wire, the electric potential was also generated on an opposite hand. In addition, there were many body parts on a foot side with the greater electric potential than the hand extending to the AC wire side. In this way, it was found that the electric potential was generated on the entire human body. It was also found that the human body had the floating electric potential from the ground and that the electric potential differed by part of the human body.

However, when it is considered that the human body is a conductor of several kΩ and is located away from the AC wire and the ground by an impedance of several MΩ or greater, it is unlikely that a potential difference of several tens of V or greater occurs in the human body, which causes operation of the voltage detector.

As the result of the examination, it was found that the AC potential wireless measuring instrument used for the measurement did not measure an electrode potential from the ground but indicated a current level flowing through an electrode. Although the human body potential was floating from the ground, the human body itself was in the same potential state, and a current value flowing through each part of the human body varied according to a surrounding impedance relationship. As a result, the measurement value by the AC potential wireless measuring instrument varied according to the current value.

As illustrated in FIG. 1, when a human body H approaches a 100-V AC wire W, currents $i_1$, $i_2$, $i_3$ flow into the human body H from the AC wire W through an arm, a trunk, and a head, respectively. With these currents, the human body H obtains an AC voltage from the ground G. The AC voltage is 30 V herein. Then, due to the human body potential, a current $i_4$, a current $i_5$, a current $i_6$, and a current $i_7$ flow out of the human body H through an opposite arm from the arm on the AC wire W side, both feet, and the head, respectively, by a capacitance between the human body H and the ground G.

A current ratio at the time varied significantly depending on a relationship among the AC wire W, the human body H, and the ground G. However, in an environment where one of the hands was brought close to the AC wire W while a wall was present on an opposite side of the AC wire W, the current values as illustrated in FIG. 1 were obtained. The current values were $i_1$=0.1 µA, $i_2$=0.2 µA, $i_3$=0.1 µA, $i_4$=0.02 µA, $i_5$=0.18 µA, $i_6$=0.18 µA, and $i_7$=0.02 µA. As the result, it is considered that voltage detection operation can be performed even when the voltage detector is held on the opposite arm from the arm on the AC wire W side and, furthermore, the foot is more sensitive than the arm.

Since the conventional general voltage detector is set to detect levels of the currents $i_1$, $i_2$ from the wire at the time when the voltage detector is brought close to the AC wire, such a voltage detector cannot detect the outflow current in a low level from the human body, such as the currents $i_4$, $i_7$. In addition, due to an idea of a model the human body=the ground potential, the currents $i_5$, $i_6$ in the relatively high current levels cannot be used. Here, FIG. 1 illustrates the typical current distribution. In reality, the current input/output occurs at a greater variety of the human body parts.

In addition, under a condition that the human body is poorly insulated and the human body is at the same potential as the ground, only the inflow currents $i_1$, $i_2$, $i_3$ can be used. For this reason, the human body potential cannot be detected. When the human body with the bare feet was actually set at the same potential as the ground, the voltage detector on the opposite side of the AC wire did not respond.

Just as described, it was found that, when the human body approached a voltage source, the current flew into the human body from the voltage source through the arm, the trunk, and the head, the human body obtained the AC potential from the ground by this current, and, with the human body potential, the current flew out of the human body through the opposite arm from the voltage source side, both of the feet, and the head by the capacitance between the human body and the ground.

Figure 2:
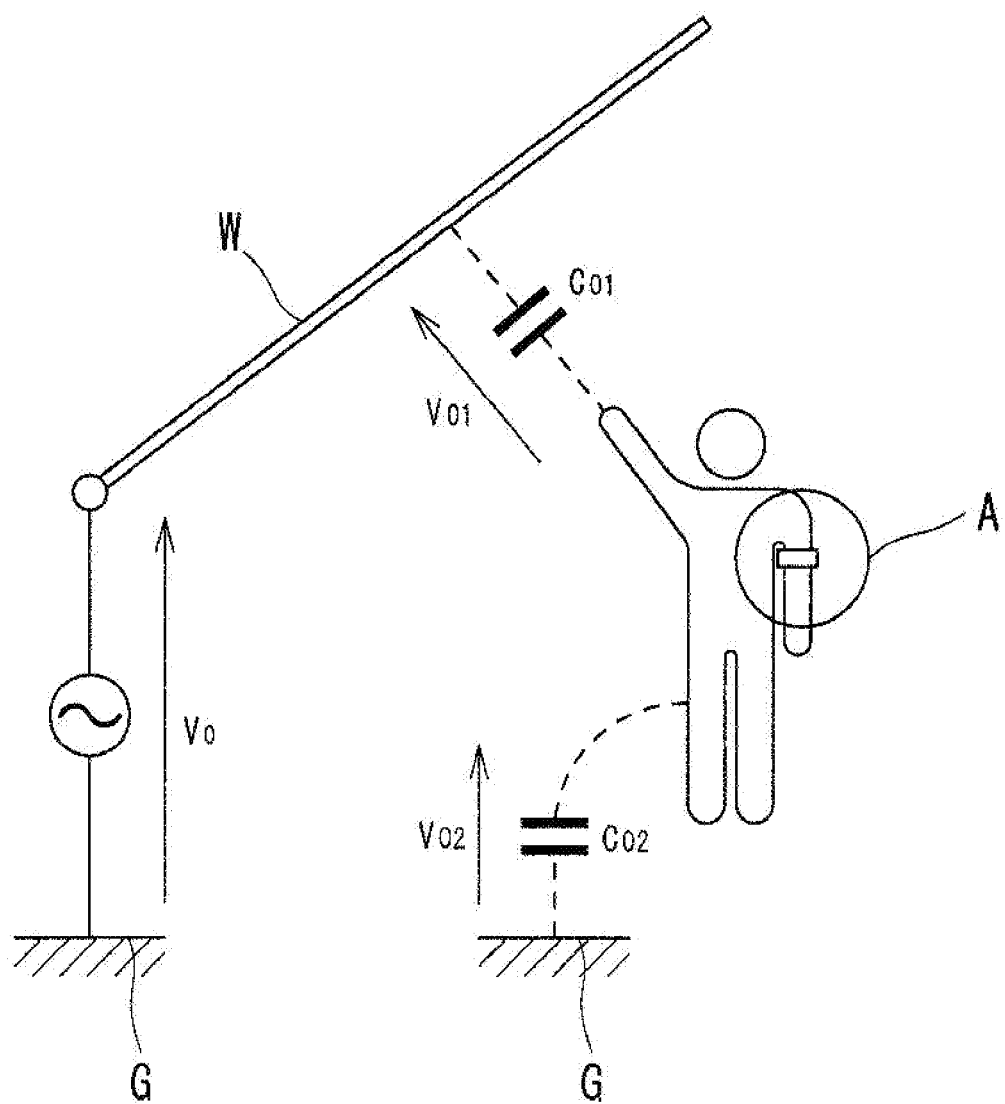
FIG. 2 is a principle schematic view of a main circuit related to a voltage that is induced in the human body according to a first embodiment of the present disclosure.

The present disclosure has been made on the basis of this principle. A combined capacitance (series connection of $C_{01}$ and $C_{02}$) $C_0$ of a closed circuit (hereafter referred to as a main circuit) from a voltage source W to the ground G through the human body H illustrated in FIG. 2 is expressed by the following equations 1, 2. Here, $V_0$ represents an electric potential of the voltage source W with respect to the ground G, $V_{01}$ represents an electric potential by an electrostatic capacitance $C_{01}$ between the voltage source W and the human body H, and $V_{02}$ represents an electric potential by an electrostatic capacitance $C_{02}$ of the human body H with respect to the ground G.

$$\frac{1}{C_0} = \frac{1}{C_{01}} + \frac{1}{C_{02}} = \frac{C_{01}+C_{02}}{C_{01}C_{02}} \quad \text{[Equation 1]}$$

$$\therefore C_0 = \frac{C_{01}C_{02}}{C_{01}+C_{02}} \quad \text{[Equation 2]}$$

Thus, the following equations 3, 4 are obtained, and it is found that the human body H has the electric potential ($V_{02}$) with respect to the ground G.

$$V_{01} = V_0 \cdot \frac{C_{02}}{C_{01}+C_{02}} \quad \text{[Equation 3]}$$

$$V_{02} = V_0 \cdot \frac{C_{01}}{C_{01}+C_{02}} \quad \text{[Equation 4]}$$

In addition, the following equations 5, 6 are obtained. Accordingly, as the human body H approaches a charged part (d in $C_{01}$ is reduced, and $C_{01}$ is increased), $V_{02}$ is increased. Thus, when $V_{02}$ can be detected, it is possible to detect that "a person (the human body H) approaches the charged part".

$$V_{02} = V_0 \cdot \frac{C_{01}}{C_{01}+C_{02}} = V_0 \cdot \frac{1}{1+C_{02}/C_{01}} \quad \text{[Equation 5]}$$

$$C = \frac{\varepsilon S}{d} \quad \text{[Equation 6]}$$

Figure 3A:
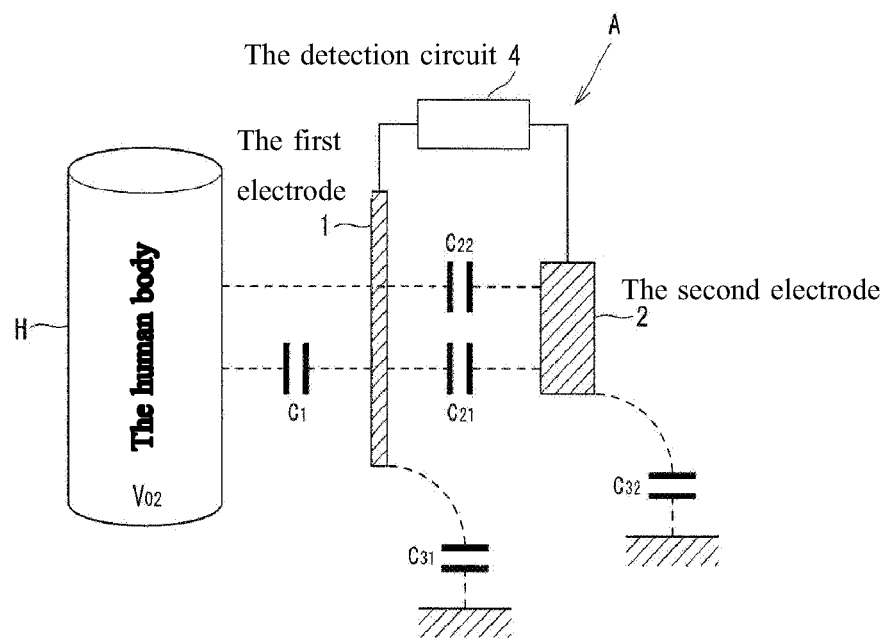
FIG. 3A is a schematic configuration view illustrating a principle of a detection circuit in a voltage detector according to the first embodiment of the present disclosure.
Figure 3B:
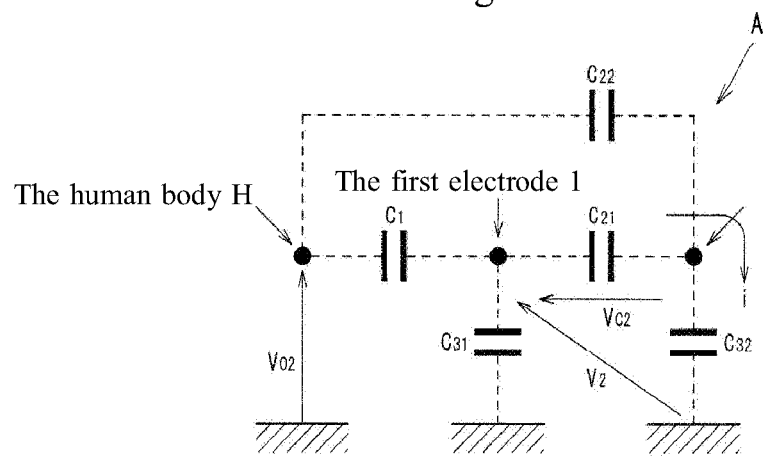
FIG. 3B is an equivalent circuit diagram thereof.

FIG. 3A is a schematic configuration view illustrating a section A in FIG. 2, that is, a detection principle of a voltage detector A according to the present disclosure, and FIG. 3B is an equivalent circuit diagram thereof. This voltage detector A is of an armband type that is wrapped around the arm of the human body H, and includes a first electrode 1 and a second electrode 2. Here, $C_1$ represents an electrostatic capacitance between the human body H and the first electrode 1, $C_{21}$ represents an electrostatic capacitance between the first electrode 1 and the second electrode 2, $C_{22}$ represents an electrostatic capacitance between the human body H and the second electrode 2, $C_{31}$ represents an electrostatic capacitance between the first electrode 1 and the ground G, and $C_{32}$ represents an electrostatic capacitance between the second electrode 2 and the ground G.

Figure 4A:
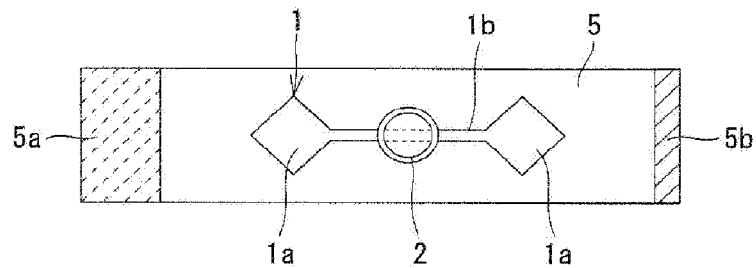
FIG. 4A is an external front view of the voltage detector according to the first embodiment of the present disclosure.
Figure 4B:
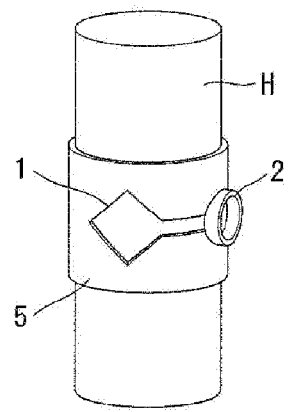
FIG. 4B is a view illustrating a worn state of the voltage detector on the human body.
Figure 4C:
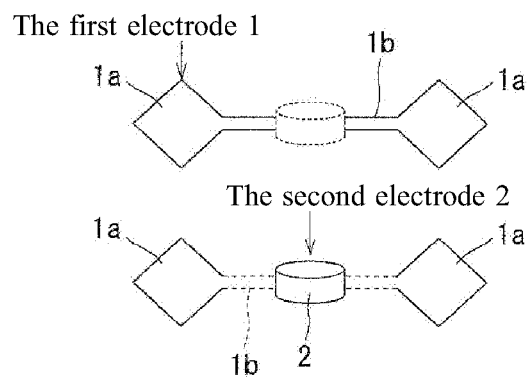
FIG. 4C is an exploded view of an electrode of the voltage detector.

In addition, a detection circuit 4 is provided between the first electrode 1 and the second electrode 2. Then, as illustrated in FIG. 4A, FIG. 4B, the first electrode 1, the second electrode 2, and the detection circuit 4 are attached to a surface of an armband-type band body 5, and the band body 5 can be attached to a worker's arm by male and female hook and loop fasteners 5a, 5b provided to front and back surfaces in end portions of the band body 5. In addition, the detection circuit 4 is not shown in FIG. 4A, FIG. 4B, FIG. 4C. The FIG. 4C is an exploded view of the first electrode 1 and the second electrode 2.

It is expected that an entire combined capacitance of this voltage detector A is expressed by the following equation 7. In addition, a voltage $V_{C2}$ that is generated between the first electrode 1 and the second electrode 2 is expressed by the following equation 8. This $V_{C2}$ is a detectable voltage.

$$\frac{1}{C} = \frac{C_1 C_{21} + C_1 C_{32} + C_{21} C_{31} + C_{21} C_{32} + C_{31} C_{32}}{C_1 (C_{21} C_{31} + C_{21} C_{32} + C_{31} C_{32})} + \frac{1}{C_{22}} \quad \text{[Equation 7]}$$

$$V_{C2} = V_{02} \cdot \frac{C_{32}}{C_{21} + C_{32} + \frac{C_{21} C_{31}}{C_1} + \frac{C_{21} C_{32}}{C_1} + \frac{C_{31} C_{32}}{C_1}} \quad \text{[Equation 8]}$$

$$= V_{02} \cdot \frac{1}{\frac{C_{21}}{C_{32}} + 1 + \frac{C_{21} C_{31}}{C_1 C_{32}} + \frac{C_{21}}{C_1} + \frac{C_{31}}{C_1}}$$

From the above equation 8, when $C_1$ is increased and $C_{21}$ is reduced, $V_{C2}$ is increased, and thus detectable $V_{C2}$ can be obtained. In addition, when $C_{32}$ is increased, further easily detectable $V_{C2}$ can be obtained. Furthermore, when $C_{22}$ is reduced, the current through the detection circuit 4 can be increased, which is advantageous for the detection.

From the above, $C_1$ is increased by increasing "S" in $C = \varepsilon S/d$ and reducing "d". For this reason, the first electrode 1 was formed as an electrode that had a large area, had flexibility to be wrapped around the human body H, and had such a shape that the electrode contacting the second electrode 2 is thin. In this way, "S" in $C = \varepsilon S/d$ was reduced, and $C_{21}$ was reduced. An electrode plate 1a on each side of the first electrode 1 illustrated in FIG. 4A, C was formed to have a square shape to increase an area thereof, and a connection section 1b connecting these electrode plates 1a, 1a was formed as a band-shaped thin electrode plate. In this way, the first electrode 1 obtained the flexibility as a whole.

Meanwhile, the second electrode 2 was formed to have a small perpendicular projection area with respect to the first electrode 1, so as to reduce "S" and $C_{21}$. In addition, the second electrode 2 was formed to have a small perpendicular projection area with respect to the human body, so as to reduce "S" and $C_{22}$. Furthermore, the second electrode 2 secured an area (a lateral area) with respect to a space (the ground), so as to increase $C_{32}$. The second electrode 2 illustrated in FIG. 4A, B, C has a cylindrical shape and is raised from the connection section 1b of the first electrode 1.

With these configurations, the voltage $V_{C2}$ that is generated between the first electrode 1 and the second electrode 2 is increased, so as to be detectable. In addition, when the first electrode 1 is directly placed and tightly attached to the human body H, $C_1$ becomes infinite, $V_{C2}$ is increased as expressed by the equation 8, and the sensitivity is thereby improved.

Figure 5A:
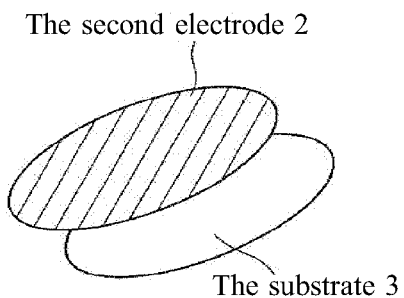
FIG. 5A, FIG. 5B and FIG. 5C include perspective views, each of which illustrates a shape example of a second electrode of the voltage detector according to the first embodiment of the present disclosure.
Figure 5B:
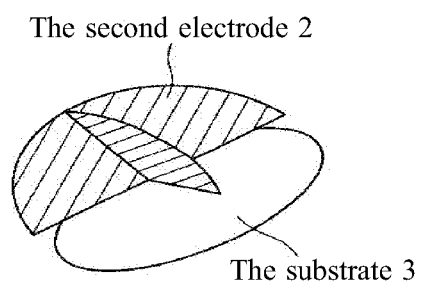
Figure 5C:
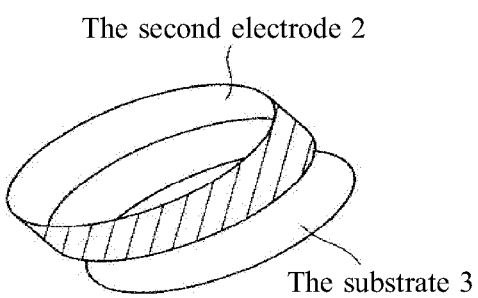

However, the shape of the first electrode 1 is not limited to that illustrated in FIG. 4A, B, C. In addition, the shape of the second electrode 2 is not limited to the cylindrical shape, either. For example, the second electrode 2 may have a circular plate shape as illustrated in FIG. 5A, or may have a shape that two semi-circular plates are crossed in a cruciform shape as illustrated in FIG. 5B. FIG. 5C illustrates the second electrode 2 in the cylindrical shape. Each of these second electrodes 2 is placed on the connection section 1b of the first electrode 1 via a substrate 3 including an insulation material.

FIG. 6 illustrates a distance at the time when a warning buzzer rang. The warning buzzer rang either when a person, who wore each of detectors A with the second electrodes 2 having shapes illustrated in FIGS. 5A, 5B, and 5C, approached the voltage source at the certain voltage from the human body side (the side of the arm without the voltage detector A) or when such a person approached the voltage source from the sensor side (the side of the arm wearing the voltage detector A).

As a result, it was verified that, of the three types of the second electrodes 2, the cylindrical second electrode 2 illustrated in FIG. 5C was the most sensitive.

Figure 7:
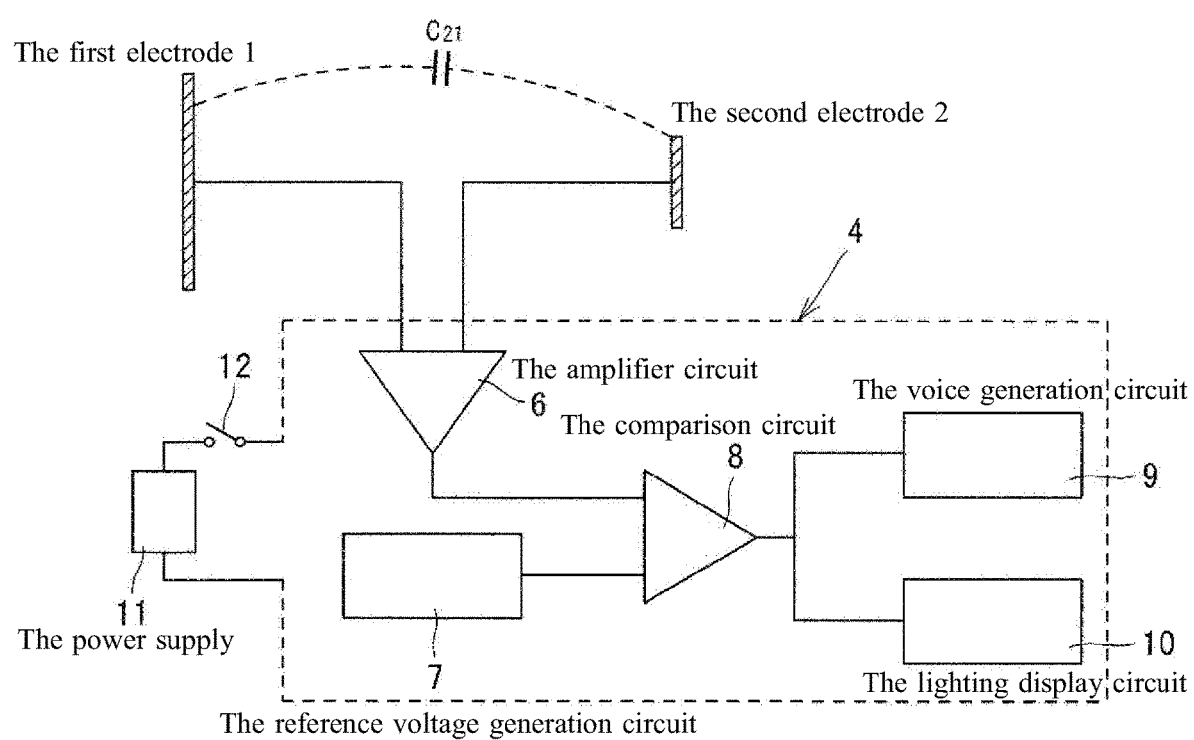
FIG. 7 is a configuration view of a detection circuit in the voltage detector according to the first embodiment of the present disclosure.

As illustrated in FIG. 7, a configuration of the detection circuit 4 is provided with an amplifier circuit 6, which amplifies the voltage $V_{C2}$, and a reference voltage generation circuit 7. The voltage $V_{C2}$ is generated by a current signal that flows through $C_{21}$ between the first electrode 1 and the second electrode 2. A voice generation circuit 9 and a lighting display circuit 10 are actuated only when a signal is output from a comparison circuit 8 that compares between an output signal of the amplifier circuit 6 and an output signal of the reference voltage generation circuit 7. The detection circuit 4 includes a power supply 11, and power is supplied to each of the circuits by turning on a switch 12 of the power supply 11.

Next, a description will be made on a voltage source approach warning method by the voltage detector A according to the present disclosure. During the work, the worker who wears the voltage detector A first turns on the switch 12 of the detection circuit 4. Then, when the worker approaches the AC voltage source, a minute current flows into the worker. The human body obtains the electric potential $V_{02}$ by this current. The voltage of the first electrode 1 is divided by the potential $V_{02}$ through the electrostatic capacitance $C_1$ and obtains the electric potential $V_2$. The voltage of the second electrode 2 obtains such an electric potential that the current flowed out by the electric potential $V_2$ is divided by $C_{21}$ and $C_{32}$. This outflow current i generates a potential difference $V_{C2}$ between the electrostatic capacitance $C_{21}$, which is detected by the detection circuit 4. At this time, in the case where the output signal, which is generated by amplifying the potential difference $V_{C2}$ between the electrostatic capacitance $C_{21}$ caused by the outflow current i, is greater than a reference voltage, alarm is emitted from the voice generation circuit 9, and the lighting display circuit 10 is lit. In this way, the worker who wears the voltage detector A recognizes the approach to the AC voltage source. Here, even in the case where the worker keeps the switch 12 on, neither the voice generation circuit 9 nor the lighting display circuit 10 is actuated until the worker approaches the AC voltage source.

In the first embodiment described above, the voltage detector A is of the armband type. However, the voltage detector A is not limited thereto. The voltage detector A only needs to be attached to any of the head, a neck, the trunk, the foot, an upper body, or a lower body of the human body. In addition, in the first embodiment described above, the voltage detector A is attached to the armband-type band body 5. However, the present disclosure is not limited thereto. The voltage detector A may be configured that only the first electrode 1 is wrapped around the human body and the second electrode 2, which is separated from this first electrode 1, may be attached to another part of the human body. Furthermore, the first electrode 1 is the flexible flat plate. However, the first electrode 1 is not limited thereto, and may be any type of a conductor such as a braided conductor.

Second Embodiment

Next, a description will be made on a voltage detector B according to a second embodiment of the present disclosure with reference to FIG. 8 to FIGS. 13A, 13B.

In the first embodiment, the first electrode 1 is the electrode that has the large area, has the flexibility to be wrapped around the human body H, and has such a shape that the electrode contacting the second electrode 2 is thin. In this way, "S" in $C=\varepsilon S/d$ is reduced, and $C_{21}$ is reduced. However, it was found that the voltage could be detected on the basis of the above-described principle even when the first electrode was not tightly attached to the human body H. A description thereon will be made in the second embodiment.

Figure 8:
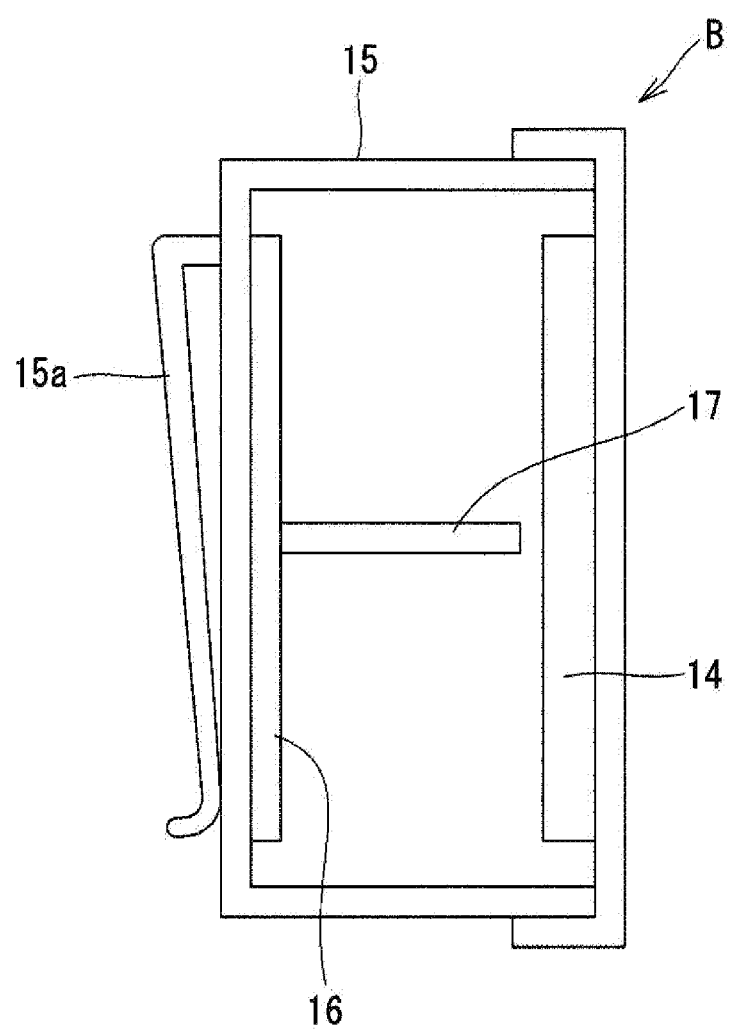
FIG. 8 is a schematic vertical cross-sectional view illustrating an example of a voltage detector according to a second embodiment of the present disclosure.
Figure 9:
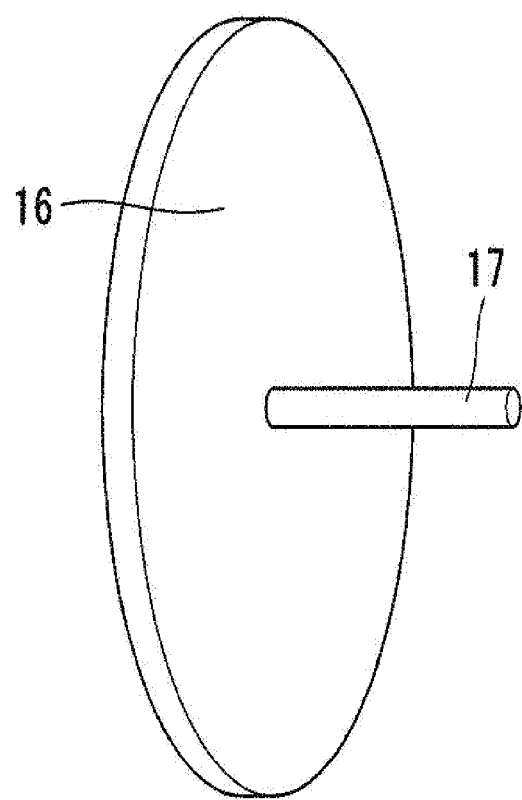
FIG. 9 is a perspective view illustrating an electrode in the example of the voltage detector according to the second embodiment of the present disclosure.

As illustrated in FIG. 8 and FIG. 9, in an example of the voltage detector B in the second embodiment, a first electrode 16, which is formed of a circular plate, is accommodated in a box-shaped insulation case 15, a rod-shaped second electrode 17 is provided perpendicularly in a central portion of a surface of the first electrode 16, and the same detection circuit 4 as that in the first embodiment is further provided between these first electrode 16 and second electrode 17. In addition, a clip 15a is provided to a side surface of the insulation case 15. By forming a first electrode 16 in a circular plate and second electrode 17 in a rod-shaped, the voltage generated between the first electrode and the second electrode typically is increased. Therefore, it is possible to reliably capture the voltage $V_{02}$ generated to the human body.

Figure 10:
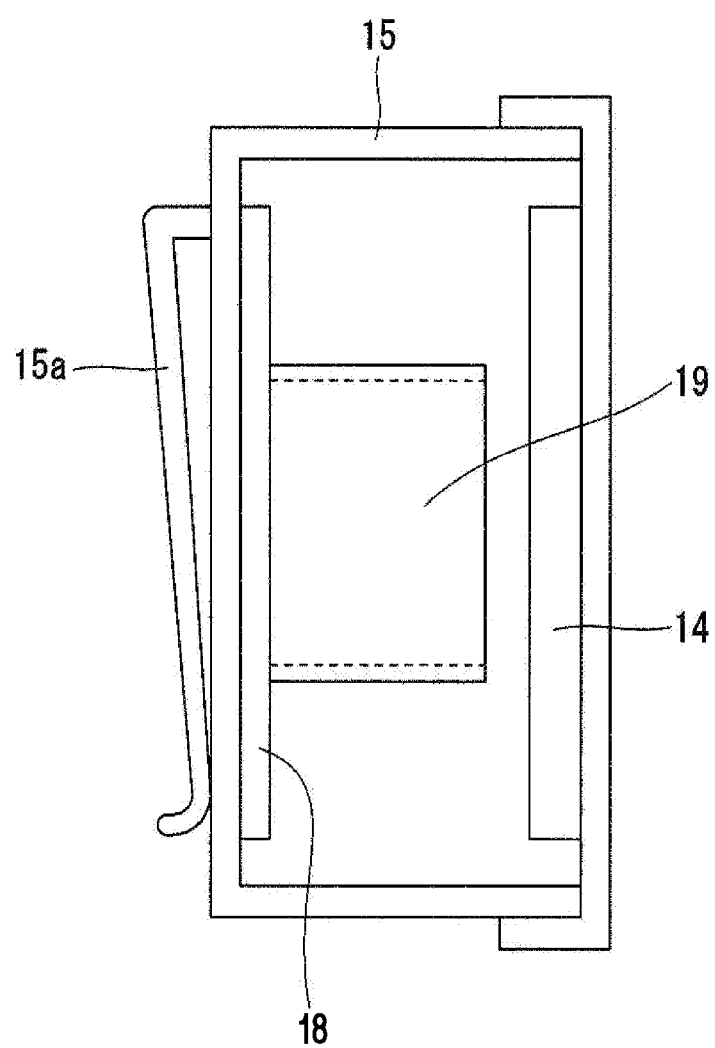
FIG. 10 is a schematic vertical cross-sectional view illustrating another example of the voltage detector according to the second embodiment of the present disclosure.
Figure 11:
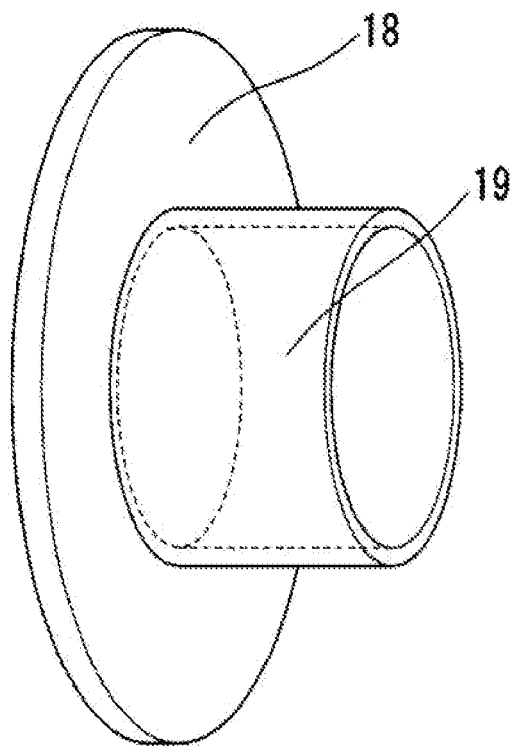
FIG. 11 is a perspective view illustrating an electrode in the other example of the voltage detector according to the second embodiment of the present disclosure.

As illustrated in FIG. 10 and FIG. 11, in another example of the voltage detector B in the second embodiment, a first electrode 18, which is formed of a circular plate, is accommodated in the box-shaped insulation case 15, a cylindrical second electrode 19 is provided perpendicularly in a central portion of a surface of the first electrode 18, and the same detection circuit 4 as that in the first embodiment is further provided between these first electrode 18 and second electrode 19. In addition, the clip 15a is provided to the side surface of the insulation case 15. By forming a first electrode 18 in a circular plate and second electrode 19 in a cylindrical, the voltage generated between the first electrode and the second electrode typically is increased. Therefore, it is possible to reliably capture the voltage $V_{02}$ generated to the human body.

Figure 12A:
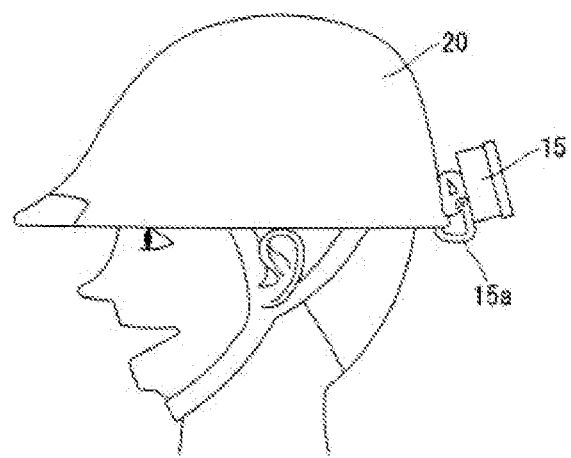
Figure 12B:
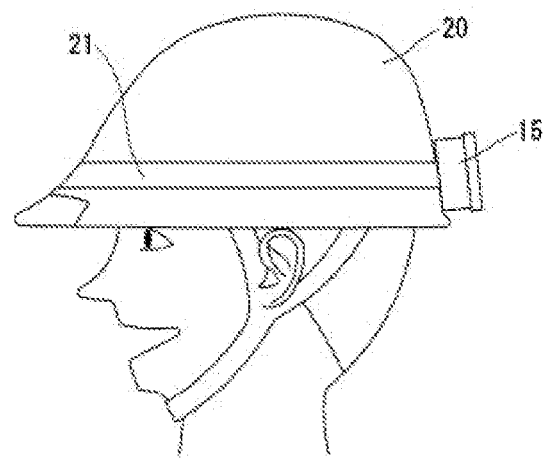
Figure 13A:
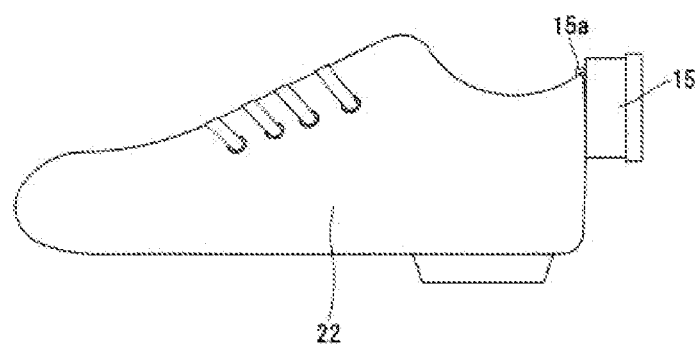
Figure 13B:
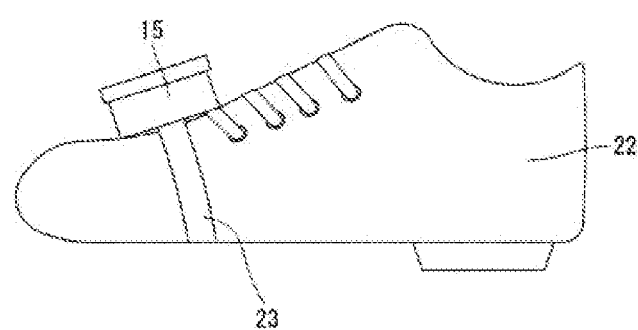

As illustrated in FIG. 12A, the insulation case 15 of this voltage detector B is attached to a rear portion of a work helmet 20 by the clip 15a. Although the clip 15a illustrated in FIG. 12A has a somewhat different configuration from those illustrated in FIG. 8 and FIG. 10, but has the same gripping function. In addition, as illustrated in FIG. 12B, there is a case where the insulation case 15 is attached to the work helmet 20 by a band 21. Furthermore, as illustrated in FIG. 13A, the insulation case 15 can also be attached to a heel of a work shoe 22 by the clip 15a. Moreover, as illustrated in FIG. 13B, the insulation case 15 can also be attached to a top side of a tip of the work shoe 22 by a band 23.

Just as described, the first electrode 16 or 18 is attached to the human body H via the insulation case 15 and one of the helmet 20, the work shoe 22, the work clothing (not illustrated) and the belt (not illustrated) as dielectric bodies. Thus, when the human body H approaches the voltage source W, the minute current flows into the human body H of the worker. Accordingly, the electrostatic capacitance $C_1$ between the human body H and the first electrode 16 or 18 becomes less than that in the first embodiment. However, the detection circuit 14 detects the current between the first electrode 16 and the second electrode 17 or between the first electrode 18 and the second electrode 19, and thereby emits the warning. The worker typically always wears any of the work clothing, the helmet, the shoes, and the belt during the electrical service, and the insulation container that accommodates the first electrode and the second electrode only needs to be attached to any of these. Therefore, the voltage detector can easily be worn by the worker.

A description will hereinafter be made on a verification test that was performed by using the voltage detector B. First, the distance and electric field strength (a magnitude of the electric field) were measured at each voltage of the AC voltage source.

The electric field strength was measured by using a digital electromagnetic radiation tester (GM3120). In regard to a charging level of the human body, an electrode portion was pressed against the human body to measure the electric field strength. The GND of the tester was connected to the ground by a cable.

Figure 14C:
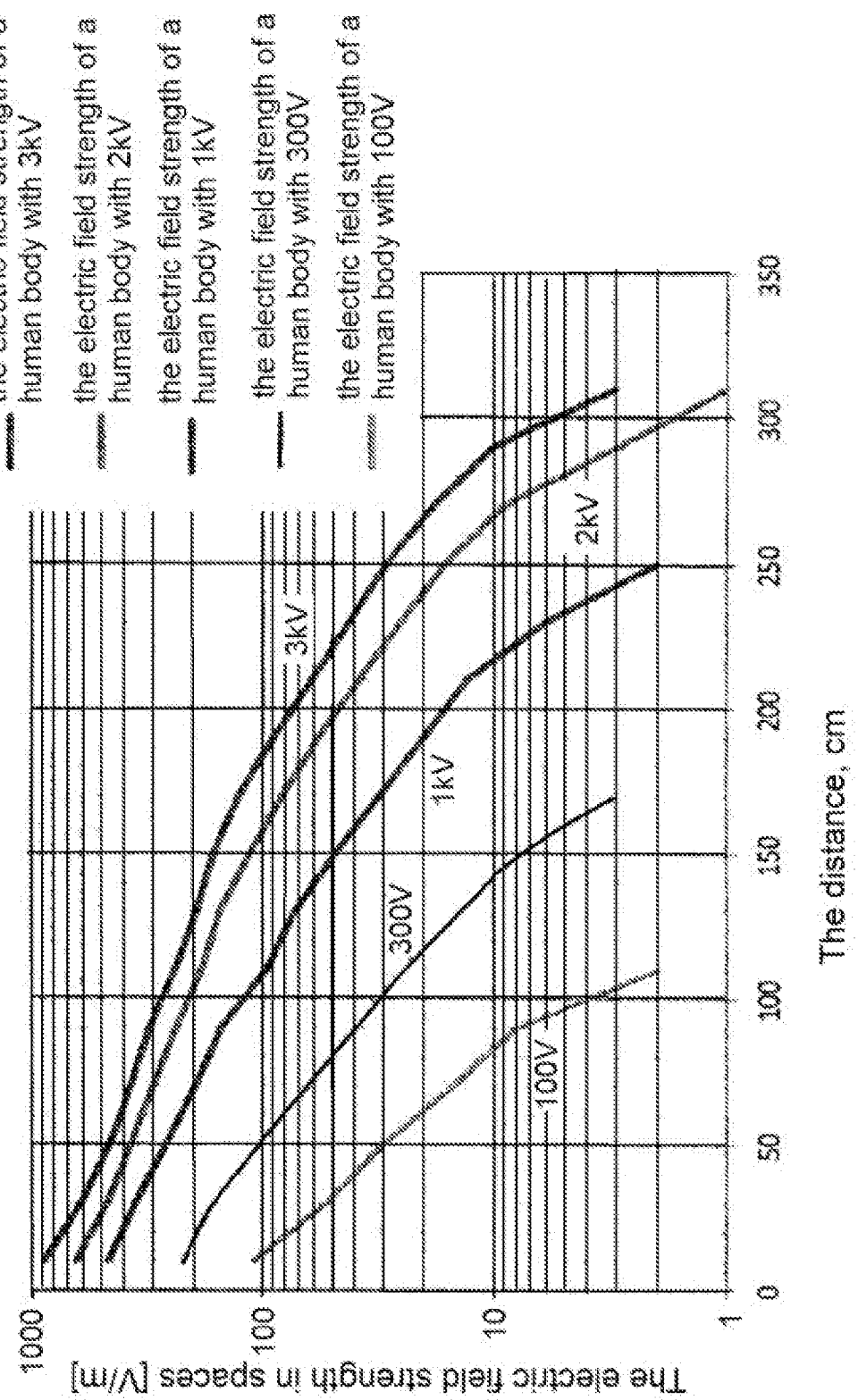

FIGS. 14A, 14B and 14C include a table and a graph illustrating the measurement result, that is, values of the electric field strength with respect to the distance between the voltage source and the human body at each voltage. It is understood from these table and graph that 96 V/m was measured with the distance of 110 cm between the voltage source and the human body when the AC voltage source had the voltage 1 kV, and 240 V/m was measured with the distance of 110 cm between the voltage source and the human body when the AC voltage source had the voltage 3 kV. From the above, it was found that the electric field strength of 96 V/m was detected with the distance of approximately 1 m from the voltage source at 1 kV or greater.

Figure 15:
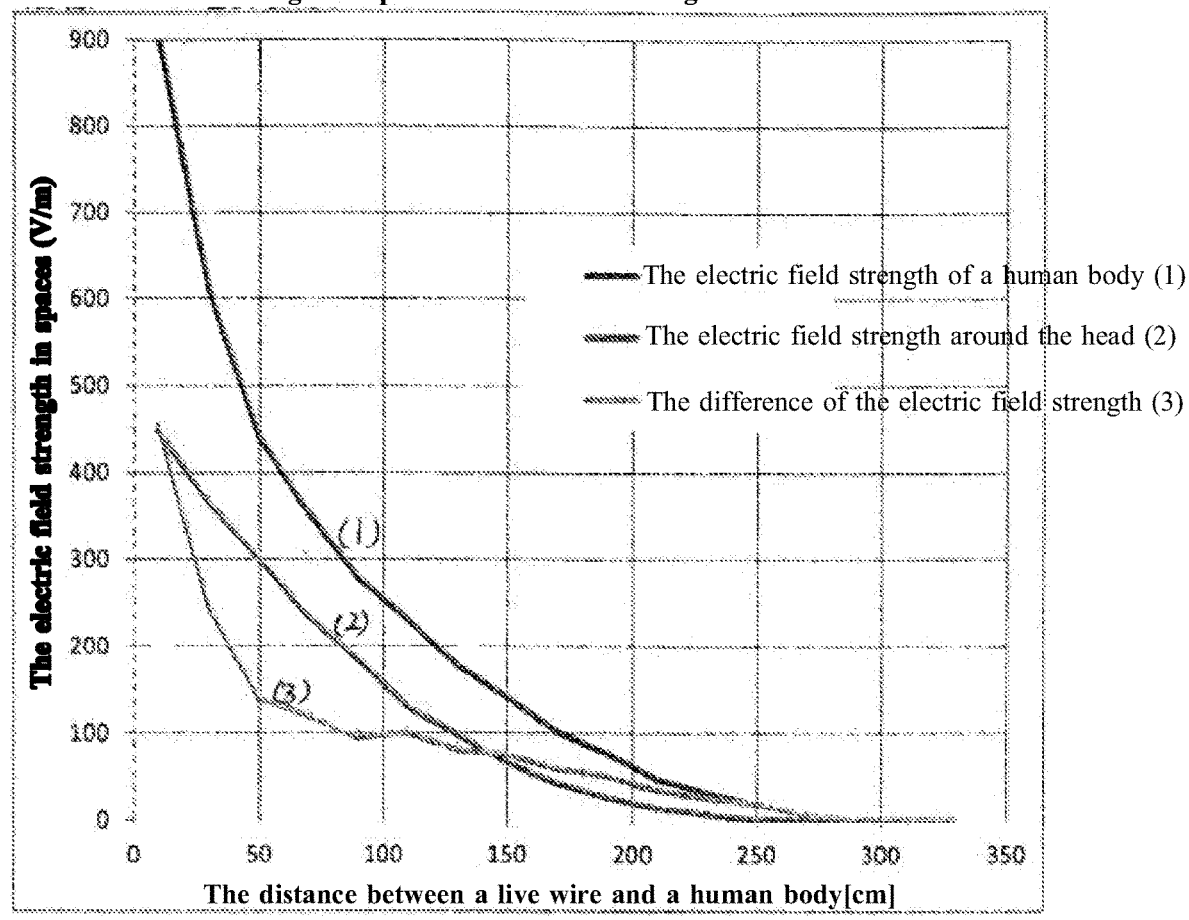
FIG. 15 is a graph illustrating measurement results of the electric field strength in the human body and a space around a head when a live wire at a voltage of 3.3 kV is the voltage source.

Next, FIG. 15 illustrates a measurement result of the electric field strength in spaces around the human body and the head when the AC voltage source was a live wire at 3 kV. FIGS. 16A, 16B and 16C illustrates a measurement result at the time when the voltage detector B was attached to the rear portion of the helmet and how the alarm was operated according to the distance from the power supply at 3 kV and according to the shapes of the first electrode and the second electrode.

In FIGS. 16A, 16B and 16C, "SENSOR-SIDE ELECTRODE" indicates the second electrode, and "HUMAN BODY-SIDE ELECTRODE" indicates the first electrode. In addition, "FORWARD APPROACH" indicates the approach of the human body to the live wire in a forward direction, and "REARWARD APPROACH" indicates the approach of the human body to the live wire in a rearward direction. "SHORT SERIES" means almost continuous sound, "SHORT 4" means that the alarm is emitted 4 times in 10 seconds, "SHORT 10" means that the alarm is emitted 10 times in 10 seconds, and "SHORT 30" means that the alarm is emitted 30 times in 10 seconds. Accordingly, "SHORT 4" means that the electric field strength is low while "SHORT SERIES" means that the electric field strength is high.

From this table, in the case of "FORWARD APPROACH", the voltage detector of the number 3, which has the rod-shaped second electrode with 10 mm in length and the first electrode in a square plate shape of 60 mm×30 mm, emits the alarm 5 times every 10 seconds with the distance of 110 cm. In the case of "REARWARD APPROACH", the voltage detector of the number 3 emits the alarm 7 times every 10 seconds with the distance of 210 cm. Meanwhile, in the case of "FORWARD APPROACH", the voltage detector of the number 1, which has the rod-shaped second electrode with 20 mm in length and the first electrode in the circular plate shape with 40 mm in diameter, emits the alarm of "SHORT 30" with the distance of 70 cm. In the case of "REARWARD APPROACH", the voltage detector of the number 1 emits the alarm of "SHORT 21" with the distance of 230 cm.

In addition, in the case of "FORWARD APPROACH", the voltage detector of the number 2, which has the cylindrical second electrode with 35 mm in diameter and 7 mm in height and the first electrode in the circular plate shape with 40 mm in diameter, emits the alarm of "SHORT 21" with the distance of 190 cm. In the case of "REARWARD APPROACH", the voltage detector of the number 2 emits the alarm of "SHORT 15" with the distance of 330 cm. In the case of "FORWARD APPROACH", the voltage detector of the number 4, which has the rod-shaped second electrode with 10 mm in length and the first electrode in the circular plate shape with 40 mm in diameter, emits the alarm of "SHORT 27" with the distance of 190 cm. In the case of REARWARD APPROACH", the voltage detector of the number 4 emits the alarm of "SHORT 4" with the distance of 330 cm.

Just as described, in the case where the AC power supply is 1000 V or greater, preferably, 3000 V or greater, the function of the voltage detector is sufficiently exerted even when the first electrode is not tightly attached to the human body and the dielectric bodies, such as the helmet and the insulation case of the detector, are interposed between the first electrode and the human body. In the case where the first electrode is tightly attached to the human body, the voltage may not be detected reliably due to an influence of perspiration or the like. However, when the dielectric bodies are interposed, just as described, the voltage detection is not affected by the perspiration or the like.

However, from the result in the table illustrated in FIGS. 16A, 16B and 16C, the voltage detectors with the configurations of the numbers 3, 2, 4, each of which emits the alarm at the distance of 100 cm from the power supply, are practical for use in the electrical service.

In the first embodiment and the second embodiment described above, the voice generation circuit 9 and the lighting display circuit 10 are provided to the voltage detector A or B. However, it can also be configured that, instead of providing these, the output from the comparison circuit 8 is received by a transmission section (not illustrated), the signal is wirelessly transmitted to the outside, a communication device or a terminal device separately provided from the voltage detector A or B receives the signal, and the device emits the alarm or displays the warning.

Third Embodiment

Each of the voltage detectors A, B in the first and second embodiments described above detects the strength (the magnitude) of the voltage source such as the charged part or the power supply, and outputs the warning (the alarm) when the detected strength of the voltage source is equal to or greater than a threshold.

However, for example, even in the case where the user, such as the worker, carries the conventional voltage detector, such as the voltage detector A or the voltage detector B, to output a warning on approach to a high-voltage charged part of 6.6 kV in a cubicle, such a possibility cannot be eliminated that the voltage detector reacts to a non-target (unintended) voltage source when another voltage source is present and thus the voltage detector reacts to a nearby power line of 6.6 kV.

In addition, such a phenomenon occurs that the sensitivity of the conventional voltage detector becomes unstable when the conventional voltage detector is used in rain or at a location with a puddle. A reason therefor is considered that, due to presence of water, permittivity of $C_{O2}$ (the capacitor) is increased, that is, the electrostatic capacitance of $C_{O2}$ is increased, which consequently reduces $V_{O2}$ (the voltage). In the case where $V_{O2}$ is low, $V_{C2}$ (the voltage at both ends of the capacitor) that is detected by the voltage detector is also reduced and thus is difficult to be detected. Accordingly, the conventional voltage detector, such as the voltage detector A or the voltage detector B, that outputs the warning when the detected voltage is equal to or greater than the threshold cannot accurately output the warning on the approach of the user, such as the worker, to the voltage source, such as the charged part or the power supply, depending on the weather or the environment.

By the way, when behavior (action) of the user, such as the worker, at the time of an electric shock is considered, the following cases are considered as the case where the voltage detector has to output the warning: 1) a case where the user, such as the worker, is in very close proximity to the voltage source such as the charged part or the power supply; and 2) a case where the user, such as the worker, is approaching the voltage source such as the charged part or the power supply.

However, even in the case where the user, such as the worker, is approaching the voltage source such as the charged part or the power supply in above 2), there is a high possibility that the user recognizes the presence of the voltage source when the user is slowly approaching the voltage source. On the other hand, when the user, such as the worker, is rapidly approaching the voltage source, there is a high possibility that the user is being careless and unaware of the presence of the voltage source.

Thus, in order to handle the above problem, in this third embodiment, a description will be made on a voltage detector C capable of capturing a change in the magnitude of the voltage source per unit time.

<Configuration of Voltage Detector C>

Figure 17:
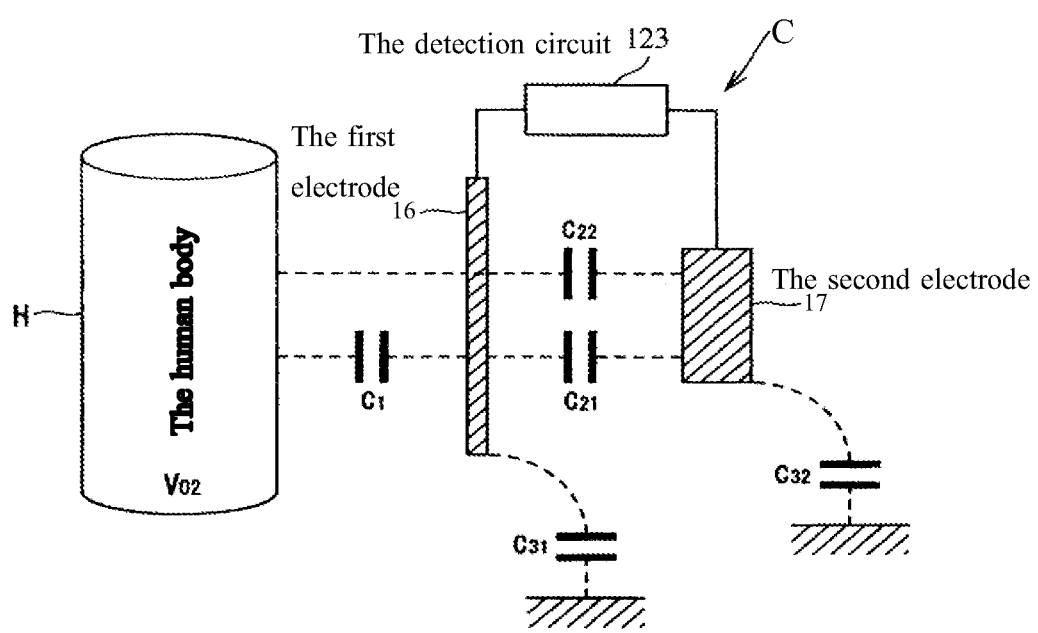
FIG. 17 is a schematic configuration view illustrating a principle of a detection section in a voltage detector according to a third embodiment of the present disclosure.

As illustrated in FIG. 17, the voltage detector C mainly includes the first electrode 16, the second electrode 17, and a detection circuit 123. The voltage detector C is a proximity sensor having a first function. As the first function, the voltage detector C detects the magnitude of the voltage source in the surroundings where the voltage detector C is approaching. Then, in the case where the detected magnitude of the voltage source is equal to or greater than a predetermined value, the voltage detector C outputs the warning such as the voice to the user such as the worker, so as to alert the user to the approach to the surrounding voltage source. The voltage detector C is also the proximity sensor having a second function. As the second function, the voltage detector C calculates a change amount of the magnitude of the voltage source per unit time. Then, in the case where the calculated change amount is equal to or greater than a predetermined value, the voltage detector C outputs the warning to alert the user, such as the worker, to the approach to the surrounding voltage source. Therefore, the voltage detector C is convenient in a point that the user such as the worker is not warned unnecessarily and thus hassle for the user such as the worker of carrying the voltage detector can be reduced.

Similar to the voltage detector B illustrated in FIG. 8 and FIG. 9, in the voltage detector C, the first electrode 16, which is formed of the circular plate, is accommodated in the box-shaped insulation case 15, the rod-shaped second electrode 17 is provided perpendicularly in the central portion of the surface of the first electrode 16, and the detection circuit 123 is further provided between these first electrode 16 and second electrode 17. In addition, the clip 15a is provided to the side surface of the insulation case 15.

However, the configuration of the voltage detector C is not limited thereto. For example, similar to the other example of the voltage detector B illustrated in FIG. 10 and FIG. 11, the first electrode 18, which is formed of the circular plate, may be accommodated in the box-shaped insulation case 15, the cylindrical second electrode 19 may be provided perpendicularly in the central portion of the surface of the first electrode 18, and the detection circuit 123 may further be provided between these first electrode 18 and second electrode 19. In addition, it may be configured that the clip 15a is provided to the side surface of the insulation case 15.

Similar to the voltage detector B illustrated in FIG. 12A, the insulation case 15 of this voltage detector C is attached to the rear portion of the work helmet 20 by the clip 15a. Alternatively, similar to the voltage detector B illustrated in FIG. 12B, it may be configured that the insulation case 15 of this voltage detector C is attached to the work helmet 20 not by the clip 15a but by the band 21. Further alternatively, similar to the voltage detector B illustrated in FIG. 13A, it may be configured that the insulation case 15 is attached to the heel of the work shoe 22 by the clip 15a. Further alternatively, similar to the voltage detector B illustrated in FIG. 13B, it may be configured that the insulation case 15 is attached to the top side of the tip of the work shoe 22 by the band 23.

Figure 18:
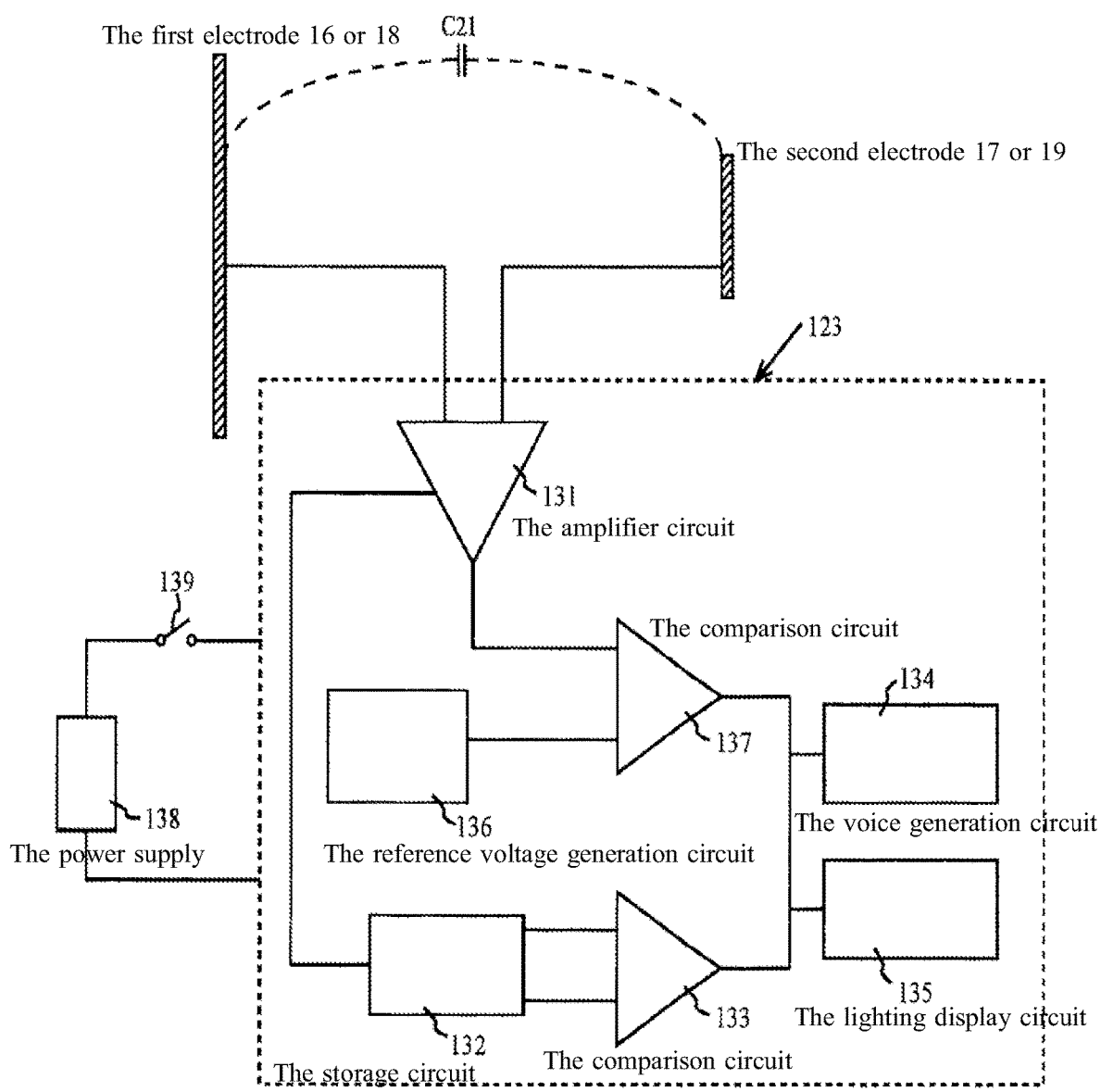
FIG. 18 is a configuration view of a detection circuit in the voltage detector according to the third embodiment of the present disclosure.

In addition, as illustrated in FIG. 18, the detection circuit 123 is configured to include: an amplifier circuit 131 that amplifies the voltage $V_{C2}$ generated by a current signal flowing in $C_{21}$ between the first electrode 16 and the second electrode 17 or between the first electrode 18 and the second electrode 19; and a storage circuit 132 that at least stores the latest amplified voltage $V_{C2}$ and the voltage $V_{C2}$ before the latest amplified voltage $V_{C2}$ (for example, 100 msec ago). A voice generation circuit 134 and a lighting display circuit 135 are actuated only when a signal is output from a comparison circuit 133 that compares the latest voltage $V_{C2}$ output from the storage circuit 132 and the voltage $V_{C2}$ before the latest voltage $V_{C2}$ (for example, 100 msec ago).

More specifically, the voltage detector C detects the magnitude of the voltage source in the surroundings where the voltage detector C approaches for plural times (twice of "the latest" and "the last time" in this third embodiment) by using the first electrode 16 or 18, the second electrode 17 or 19, the amplifier circuit 131, the storage circuit 132, and the comparison circuit 133, and calculates the change amount of the magnitude of the voltage source per unit time (for example, 100 msec). Then, in the case where the calculated change amount is equal to or greater than the predetermined value, the warning is output by the voice generation circuit 134 and the lighting display circuit 135. In this way, the voltage detector C alerts the user, such as the worker, to the approach to the surrounding voltage source.

The detection circuit 123 is also provided with a reference voltage generation circuit 136. The voice generation circuit 134 and the lighting display circuit 135 are actuated only when a signal is output from a comparison circuit 137 that compares an output signal of the amplifier circuit 131 with an output signal of the reference voltage generation circuit 136.

More specifically, the voltage detector C detects the magnitude of the voltage source in the surroundings where the voltage detector C approaches by using the first electrode 16 or 18, the second electrode 17 or 19, the amplifier circuit 131, the reference voltage generation circuit 136, and the comparison circuit 137. Then, in the case where the detected magnitude of the voltage source is equal to or greater than the predetermined value, the voice generation circuit 134 and the lighting display circuit 135 output the warning, such as the voice, to the user, such as the worker. In this way, the voltage detector C alerts the user, such as the worker, to the approach to the surrounding voltage source.

The detection circuit 123 includes a power supply 138, and the power is supplied to the detection circuit 123 by turning on a switch 139 of the power supply 138.

A principle of detection of the magnitude of the voltage source in the surroundings where the voltage detector C approaches by the voltage detector C is the same as that for the voltage detectors A, B. Thus, a description thereon will not be made.

<Examination of Effectiveness of Voltage Detector C>

Next, a description will be made on an examination result of effectiveness of the voltage detector C.

A field test of the voltage detector C was performed. In the field test, the user, such as the worker, who wore the work helmet 20 with the voltage detector C approached the high-voltage charged part of 0.6 kV in the cubicle. As a result, such a phenomenon was observed that the voltage detector C reacted to the nearby power line of 6.6 kV.

When it is considered that the power line has a columnar charge distribution in infinite length, an electric field created by the power line is $E=q/2\pi\varepsilon r$.

Figure 19:
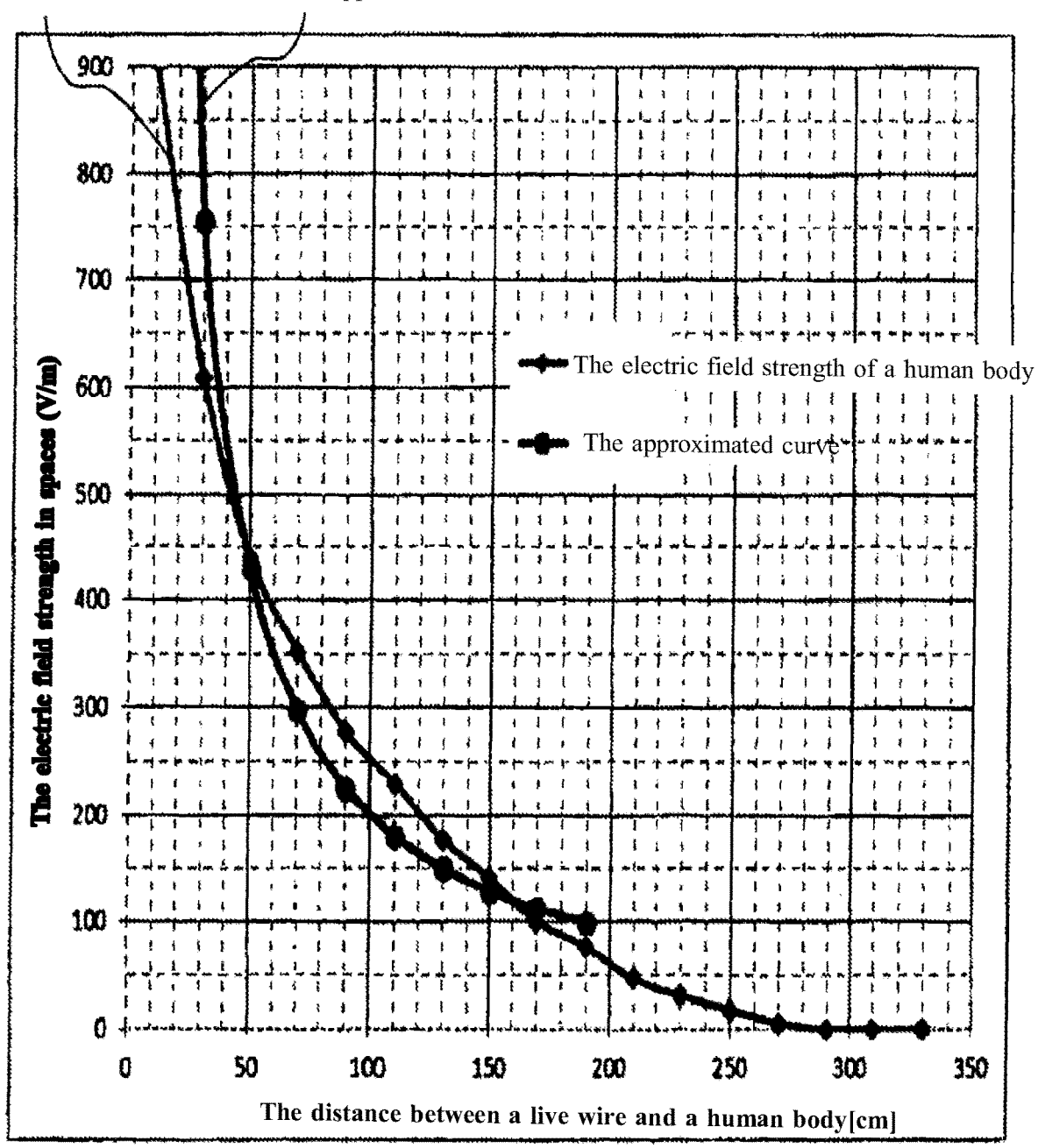
FIG. 19 is a graph in which an experimental result of a distance [cm] and the electric field strength [V/m] of the charged human body at the time when the human body of a user such as the worker approaches the live wire is represented by curve lines.

FIG. 19 illustrates an experimental result of the distance [cm] and the electric field strength [V/m] of the charged human body at the time when the human body of the user such as the worker approaches the live wire of 3 kV. With reference to this experimental result, it is found that the electric field created by the cubicle is close to $E=q/2\Pi\varepsilon r$ (inversely proportional to a distance r). An approximate curve of a curve that represents the electric field strength of the charged human body in FIG. 19 has the following equation. $E=201r^{(-1.1)}=201/r1.1$ In regard to the surrounding electric fields detected by the voltage detector C that is approaching the cubicle, which of the electric field created by the power line and the electric field created by the cubicle has a greater influence will be discussed from the above equation of the approximate curve. In regard to the distance r from the voltage detector C to the cubicle, "a distance from the power line to the voltage detector C>the distance from the cubicle to the voltage detector C" is satisfied. Thus, the electric field created by the cubicle has the greater influence. In regard to a charge amount (the current value), "the current value through the power line>the current value through the cubicle" is satisfied. Thus, the electric field created by the power line has the greater influence. Depending on a situation, it is impossible to eliminate the possibility that the voltage detector C reacts due to the presence of the power line.

As the result of the examination, it is considered that the equation of the electric field strength [V/m] of the charged human body is approximated by E=20l/r. Then, it will be further examined how the electric field (the power line) as noise influences detection of the surrounding electric field by the voltage detector C according to arrangement of the target electric field (the cubicle) and the electric field as the noise.

In the case where a positional relationship among the power line, the cubicle, and the user such as the worker has arrangement in an order of "the cubicle, the user such as the worker, and the power line", the electric field created by the power line has the influence at the time of detecting the approach of the user such as the worker to the cubicle. In detail, when the user such as the worker approaches the cubicle, the influence of the electric field created by the cubicle is boosted while the influence of the electric field created by the power line is weakened. However, a magnitude of the influence of the electric field created by the power line is inversely proportional to the distance. In addition, the distance between the power line and the user such as the worker is much greater than the distance between the cubicle and the user such as the worker. Thus, it is considered that the change amount of the magnitude of the electric field created by the power line is small near (particularly, within 100 cm of) the cubicle. For this reason, it is considered that capturing the change amount of the magnitude of the electric field per unit time at the time when the distance between the user such as the worker and the cubicle is reduced is substantially equivalent to (same as) capturing the change amount of the magnitude of the electric field created by the cubicle at the location near the cubicle.

Figure 20:
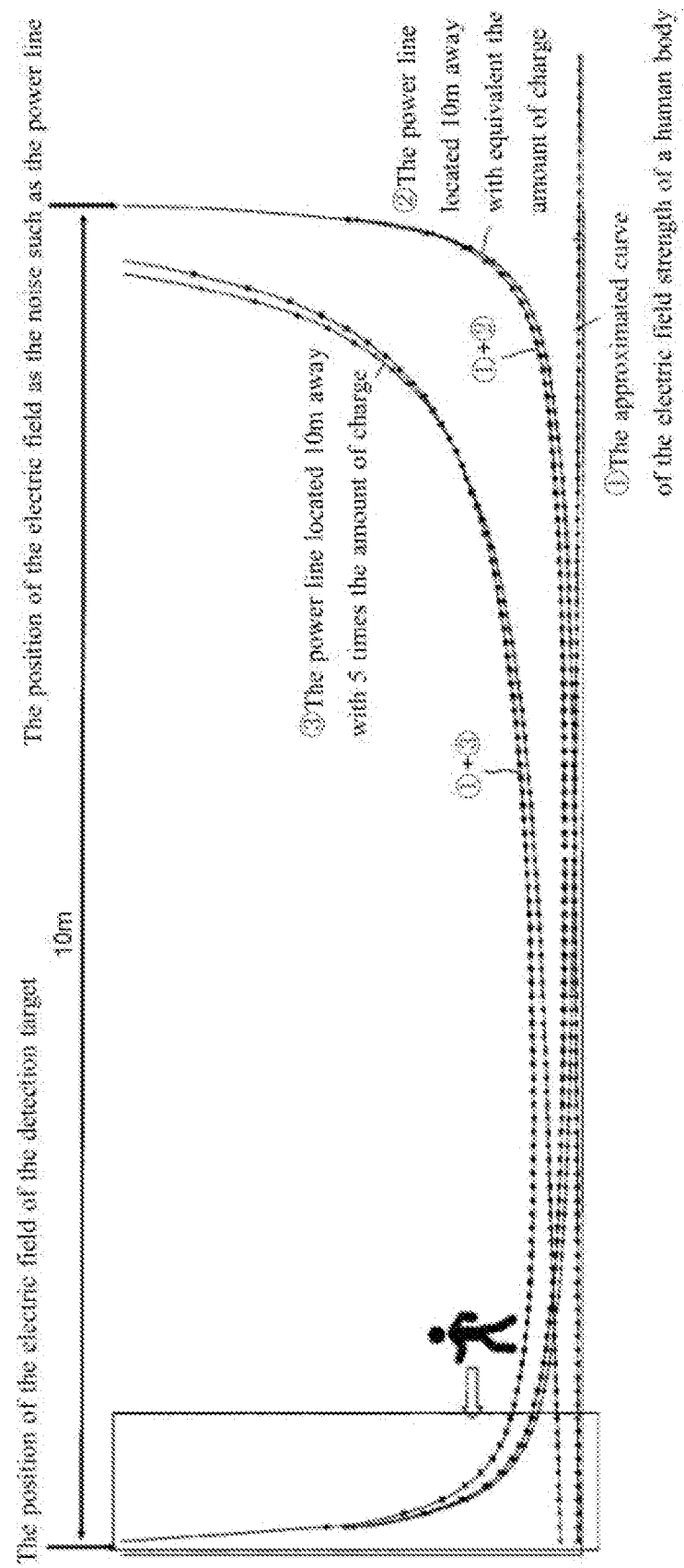
FIG. 20 is a view in which a simulation result of a distance [cm] and the electric field strength [V/m] of the charged human body at the time when the human body of the user such as the worker approaches a target electric field is indicated by curve lines.

FIG. 20 is a curve graph simulating whether the above examination result is correct with the assumption that the power line is located 10 m away from the cubicle in the above arrangement. It is understood that the user such as the worker is not affected by the electric field created by the power line when approaching to the cubicle within a range of less than 100 cm (an area surrounded by a square in FIG. 20).

In the case where the positional relationship among the power line, the cubicle, and the user such as the worker has arrangement in an order of "the power line, the cubicle, and the user such as the worker", the electric field created by the power line has the influence at the time of detecting the approach of the user such as the worker to the cubicle. In detail, when the user such as the worker approaches the cubicle, the influence of the electric field created by the cubicle is boosted while the influence of the electric field created by the power line is also boosted. As a result, it is difficult to determine to which of the electric fields the user is approaching. However, since the distance between the power line and the user such as the worker is much greater than the distance between the cubicle and the user such as the worker, it is considered that the change amount of the magnitude of the electric field created by the power line is small at the location near (particularly, within 100 cm of) the cubicle. For this reason, it is considered that capturing the change amount of the magnitude of the electric field per unit time at the time when the distance between the user such as the worker and the cubicle is reduced is substantially equivalent to (same as) capturing the change amount of the magnitude of the electric field created by the cubicle at the location near the cubicle.

Figure 21:
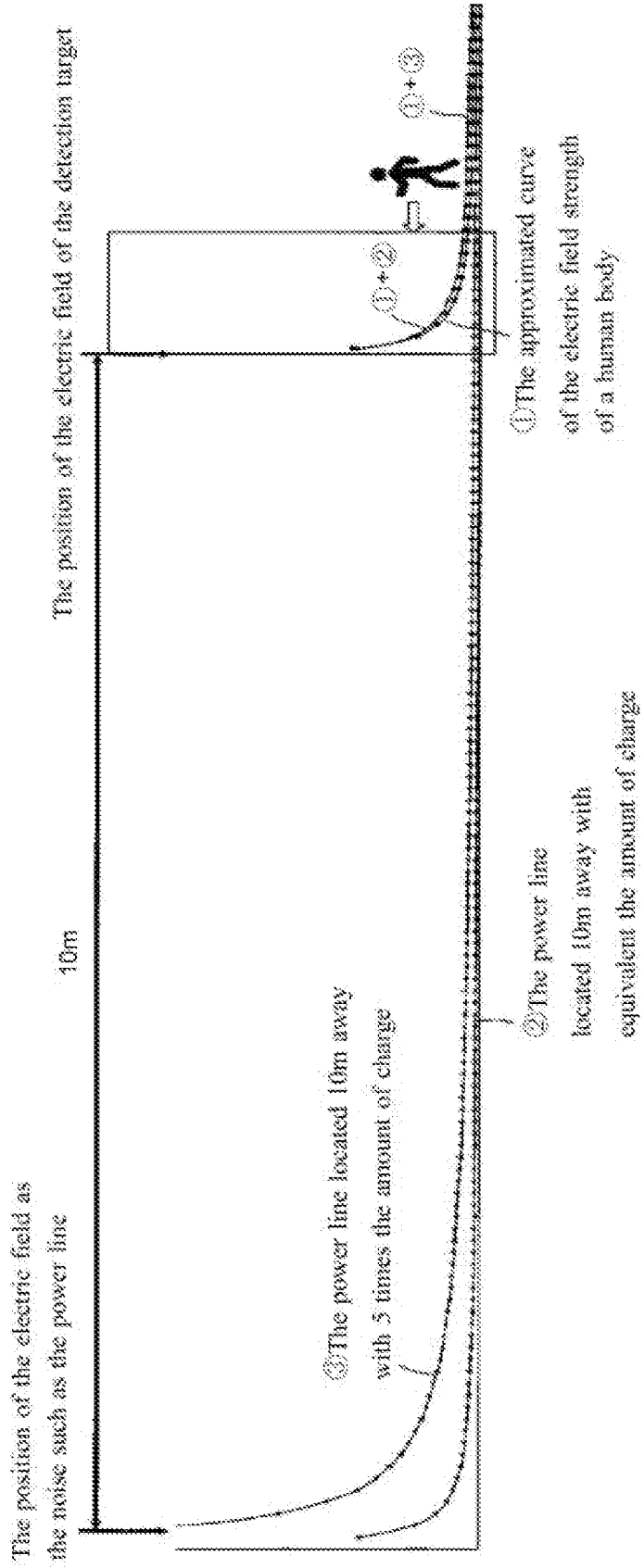
FIG. 21 is a view in which the simulation result of the distance [cm] and the electric field strength [V/m] of the charged human body at the time when the human body of the user such as the worker approaches the target electric field is indicated by curve lines.
Figure 22:
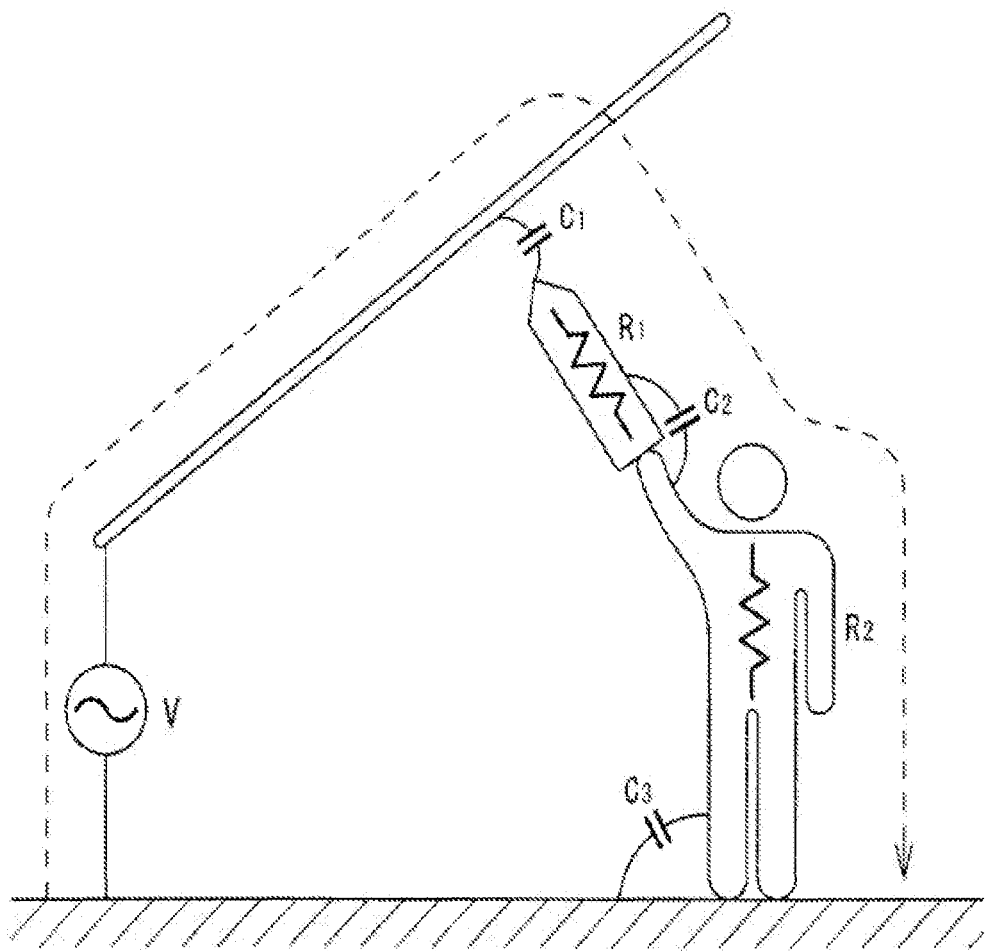
FIG. 22 is a schematic principle view of a conventional voltage detector.

FIG. 21 is a curve graph simulating whether the above examination result is correct with the assumption that the power line is located 10 m away from the cubicle in the above arrangement. It is understood that the user such as the worker is not affected by the electric field created by the power line when approaching to the cubicle within the range of less than 100 cm (an area surrounded by a square in FIG. 21).

With the configuration like that of this voltage detector C capturing the change amount of the magnitude of the electric field (the voltage source) per unit time, danger can accurately be detected even in the situation where the electric field of the detection target overlaps the electric field as the noise (for example, the electric field as the noise is present in front of the target electric field or the electric field as the noise is present behind the target electric field) or the situation where the electric field of the detection target and the electric field as the noise cancel each other (for example, the electric field of the detection target and the electric field as the noise are in opposite phases). Meanwhile, the conventional voltage detector such as the voltage detector A or the voltage detector B is configured to detect the strength of the voltage source such as the charged part or the power supply and output the warning (the alarm) when the detected strength of the voltage source is equal to or greater than the threshold. Thus, it is impossible to determine whether the warning is caused by the influence of the electric field of the detection target or by the influence of the electric field as the noise. As a result, the danger cannot accurately be detected.

<Warning Output Pattern of Voltage Detector C>

As described above, the voltage detector C according to the third embodiment has the first function to detect the magnitude of the surrounding voltage source and output the warning to the user such as the worker when the detected magnitude of the surrounding voltage source is equal to or greater than the predetermined value. The voltage detector C also has the second function to calculate the change amount of the magnitude of the voltage source per unit time and output the warning when the calculated change amount is equal to or greater than the predetermined value.

Various patterns are considered to set a way of outputting the warning based on the first function and the warning based on the second function according to a stage of a degree of the approach to the target electric field (the voltage source), the behavior of the user such as the worker, and the like. Alternatively, such a configuration may be adopted that a warning method or a warning pattern differs between the warning based on the first function and the warning based on the second function.

For example, in the case where the user such as the worker is alerted when walking toward the indoor electric field, the electric field on the ground, or the underground electric field such as of the cubicle or the high-voltage charged part, a predetermined value (=an absolute value of the magnitude of the electric field: 220 V/m) is set so as to output the warning related to the first function (for example, the continuous sound alarm or lighting of the alarm) in order to notify of an approach prohibition final dead line to the target electric field (for example, 1 m from the target electric field). In addition, a predetermined value (=the change amount of the magnitude of the electric field: 164 V/m) is set so as to output the warning related to the second function (for example, the intermittent sound alarm or the flashing alarm) in order for the user such as the worker, who is approaching the target electric field, to be cautious about his/her own action even at the location a little far away from the target electric field (for example, 1.2 m from the target electric field).

Alternatively, for example, in the case where the user such as the worker is alerted when riding in a bucket (≈basket) of a high-place service vehicle and approaching the electric field at a high place such as of a cable head or a transformer terminal on a utility pole or an overhead distribution line, a predetermined value (=the absolute value of the magnitude of the electric field: 167 V/m) is set so as to output the warning related to the first function (for example, the intermittent sound alarm or the flashing alarm) in order to notify of the approach to the target electric field (for example, 2.6 m from the target electric field). In addition, a predetermined value (=the change amount of the magnitude of the electric field: 119 V/m) is set so as to output the warning related to the second function (for example, the continuous sound alarm or lighting of the alarm) in order for the user such as the worker, who is very close to the target electric field (for example, 1 m), to be cautious about his/her own behavior (action).

Just as described, the voltage detector C can appropriately alert the user such as the worker according to the various situations, which are related to the location of the target electric field (the voltage source) and the approaching method by the user such as the worker (for example, whether the user is approaching on foot, by a vehicle, or the like), by changing the settings of the warning based on the first function and the warning based on the second function.

Modified Examples

In the third embodiment, the description has been made on the configuration that the voltage detector C has the first function and the second function. However, the configuration of the voltage detector C is not limited thereto. For example, the voltage detector C may be configured to only have the second function of calculating the change amount of the magnitude of the voltage source per unit time and outputting the warning when the calculated change amount is equal to or greater than the predetermined value.

In the third embodiment, the description has been made on the configuration that the human body is used to measure the voltage induced in the human body, that is, the magnitude of the surrounding electric field (voltage source) by the voltage detector C. However, the configuration is not limited thereto. The voltage detector C only needs to be configured to be able to measure the magnitude of the surrounding electric field.

In the third embodiment, the description has been made on the configuration that the voltage detector C outputs the combined warnings by the voice and the light. However, the configuration is not limited thereto. For example, the voltage detector C may be configured to only output the voice warning or may be configured to only output the light warning.

The description has been made on the configuration of the voltage detector C according to the third embodiment to output the warning when the magnitude of the detected surrounding electric field (voltage source) or the calculated change amount of the surrounding electric field (voltage source) is "equal to or greater" than the predetermined value. However, the configuration is not limited thereto. For example, the voltage detector C may be configured to output the warning when the magnitude of the detected surrounding electric field (voltage source) or the calculated change amount of the surrounding electric field (voltage source) "exceeds" the predetermined value.

In the third embodiment, the description has been made on, as the example of calculating the change amount of the magnitude of the electric field per unit time on the basis of the magnitude of the electric field detected by the detection circuit 123 of the voltage detector C, the configuration to calculate the change amount (=the change amount of the latest detection result from the last detection result) by comparing the latest detection result stored in the storage circuit 132 with the last detection result (for example, 100 msec ago). However, the configuration is not limited thereto. For example, the detection circuit 123 may be configured to compare the latest detection result stored in the storage circuit 132 with the detection result that is second from the last detection result (for example, 200 msec ago) and to calculate the change amount (=the change amount of the latest detection result from the detection result second from the last detection result). In summary, the detection circuit 123 only needs to have a configuration capable of calculating the change amount of the magnitude of the electric field (the voltage source) over a predetermined time.

In the third embodiment, the detection circuit 123 is configured to have a combination of the comparison circuit 133, the reference voltage generation circuit 136, the comparison circuit 137, and the like. However, the configuration of the detection circuit 123 is not limited thereto. For example, the detection circuit 123 may be configured to have a control section (not illustrated) constructed of a microcomputer including a single LSI, for example, and may be configured that the control section calculates a difference (the change amount) on the basis of the latest voltage $V_{C2}$ detected by the first electrode 16 and the second electrode 17 and the voltage $V_{C2}$ before the latest amplified voltage $V_{C2}$ (for example, 100 msec ago) and then causes the voice generation circuit 134 and the like to output the warning when the calculated difference is equal to or greater than a predetermined value.

The description has been made so far on the first to third embodiments. However, these embodiments are presented as examples and are not intended to limit the scope of the disclosure. The present disclosure can be implemented in various other modes, and various omissions, substitutions, and changes can be made thereto without departing from the gist of the disclosure. These embodiments and modifications thereof are included in the scope and the gist of the disclosure as well as in the claims and their equivalents.

REFERENCE SIGNS LIST

A: Voltage detector
B: Voltage detector
G: Ground
H: Human body
W: Voltage source
1: First electrode
1*a*: Electrode plate
1*b*: Connection section
2: Second electrode
3: Substrate
4: Detection circuit
5: Band body
5*a*: Hook and loop fastener
5*b*: Hook and loop fastener
6: Amplifier circuit
7: Reference voltage generation circuit
8: Comparison circuit 9: Voice generation circuit
10: Lighting display circuit
11: Power supply
12: Switch
15: Insulation case
15a: Clip
16: First electrode
17: Second electrode
18: First electrode
19: Second electrode
20: Helmet
21: Band
22: Work shoe
23: Band
123: Detection circuit
131: Amplifier circuit
132: Storage circuit
133: Comparison circuit
134: Voice generation circuit
135: Lighting display circuit
136: Reference voltage generation circuit
137: Comparison circuit
138: Power supply
139: Switch

The invention claimed is:

1. A voltage source approach detection voltage detector detecting approach to a voltage source, wherein
a detection circuit has: a first electrode having, as a measurement target, a voltage induced in a human body due to approach to the voltage source; and a second electrode having, as a measurement target, a voltage on the ground,
a circuit is provided to output a signal from the detection circuit at the time when the human body approaches the voltage source,
the first electrode is formed of a plate having a predetermined area with a dielectric body being interposed between the first electrode and the human body, and
the second electrode has such a shape that a perpendicular projection area to the first electrode is small while an area for the ground is large.

2. The voltage source approach detection voltage detector according to claim 1, wherein
a magnitude of the voltage source in surroundings where the voltage detector is approaching is detected for plural times,
a change amount of the magnitude of the voltage source per unit time is calculated on the basis of the detected magnitude of the voltage source, and
in the case where the change amount is equal to or greater than a predetermined value, a warning is output.

3. The voltage source approach detection voltage detector according to claim 1, wherein
a magnitude of the voltage source in surroundings where the voltage detector is approaching is detected for plural times,
in the case where the detected magnitude of the voltage source is equal to or greater than a predetermined value, a warning is output, and a change amount of the magnitude of the voltage source per unit time is calculated on the basis of the detected magnitude of the voltage source, and
in the case where the change amount is equal to or greater than a predetermined value, the warning is output.

4. The voltage source approach detection voltage detector according to claim 1, wherein
the dielectric bodies, each of which is interposed between the voltage source approach detection voltage detector and the human body, are an insulation container accommodating the first electrode and the second electrode, and any of a work cloth, a helmet, a shoe, and a belt.

5. The voltage source approach detection voltage detector according to claim 1, wherein
the first electrode is a flat plate, and
the second electrode has a pole shape that stands vertically on the flat plate of the first electrode.

6. The voltage source approach detection voltage detector according to claim 1, wherein
the first electrode is a flat plate, and
the second electrode has a cylindrical shape that stands vertically on the flat plate of the first electrode.

7. The voltage source approach detection voltage detector according to claim 1, wherein
the first electrode, the second electrode, and the detection circuit are accommodated in the insulation container.

8. The voltage source approach detection voltage detector according to claim 2, wherein
the dielectric bodies, each of which is interposed between the voltage source approach detection voltage detector and the human body, are an insulation container accommodating the first electrode and the second electrode, and any of a work cloth, a helmet, a shoe, and a belt.

9. The voltage source approach detection voltage detector according to claim 3, wherein
the dielectric bodies, each of which is interposed between the voltage source approach detection voltage detector and the human body, are an insulation container accommodating the first electrode and the second electrode, and any of a work cloth, a helmet, a shoe, and a belt.

10. The voltage source approach detection voltage detector according to claim 2, wherein
the first electrode is a flat plate, and
the second electrode has a pole shape that stands vertically on the flat plate of the first electrode.

11. The voltage source approach detection voltage detector according to claim 3, wherein
the first electrode is a flat plate, and
the second electrode has a pole shape that stands vertically on the flat plate of the first electrode.

12. The voltage source approach detection voltage detector according to claim 4, wherein
the first electrode is a flat plate, and
the second electrode has a pole shape that stands vertically on the flat plate of the first electrode.

13. The voltage source approach detection voltage detector according to claim 2, wherein
the first electrode is a flat plate, and
the second electrode has a cylindrical shape that stands vertically on the flat plate of the first electrode.

14. The voltage source approach detection voltage detector according to claim 3, wherein
the first electrode is a flat plate, and
the second electrode has a cylindrical shape that stands vertically on the flat plate of the first electrode.

15. The voltage source approach detection voltage detector according to claim 4, wherein
the first electrode is a flat plate, and
the second electrode has a cylindrical shape that stands vertically on the flat plate of the first electrode.

16. The voltage source approach detection voltage detector according to claim 2, wherein
the first electrode, the second electrode, and the detection circuit are accommodated in the insulation container.

17. The voltage source approach detection voltage detector according to claim 3, wherein
the first electrode, the second electrode, and the detection circuit are accommodated in the insulation container.
18. The voltage source approach detection voltage detector according to claim 4, wherein
the first electrode, the second electrode, and the detection circuit are accommodated in the insulation container.

\* \* \* \* \*